US008618630B2

(12) United States Patent  
Kaeriyama

(10) Patent No.: US 8,618,630 B2
(45) Date of Patent: Dec. 31, 2013

(54) SEMICONDUCTOR DEVICE

(75) Inventor: Shunichi Kaeriyama, Tokyo (JP)

(73) Assignee: NEC Corporation, Tokyo (JP)

( * ) Notice: Subject to any disclaimer, the term of this patent is extended or adjusted under 35 U.S.C. 154(b) by 273 days.

(21) Appl. No.: 13/203,199

(22) PCT Filed: Feb. 17, 2010

(86) PCT No.: PCT/JP2010/000983

§ 371 (c)(1),
(2), (4) Date: Aug. 24, 2011

(87) PCT Pub. No.: WO2010/113383

PCT Pub. Date: Oct. 7, 2010

(65) Prior Publication Data

US 2012/0020419 A1  Jan. 26, 2012

(30) Foreign Application Priority Data

Mar. 31, 2009  (JP) .................. 2009-084921

(51) Int. Cl.
*H01L 23/52* (2006.01)
*H01L 23/48* (2006.01)

(52) U.S. Cl.
USPC ........................................... 257/531

(58) Field of Classification Search
USPC ............... 257/528–543, E21.52, E23.141
See application file for complete search history.

(56) References Cited

U.S. PATENT DOCUMENTS

| | | | |
|---|---|---|---|
| 4,780,795 A | 10/1988 | Meinel | |
| 4,785,345 A | 11/1988 | Rawls et al. | |
| 5,952,849 A | 9/1999 | Haigh | |
| 6,249,171 B1 | 6/2001 | Yaklin et al. | |
| 6,262,600 B1 | 7/2001 | Haigh et al. | |
| 6,525,566 B2 | 2/2003 | Haigh et al. | |
| 6,873,065 B2 | 3/2005 | Haigh et al. | |
| 6,903,578 B2 | 6/2005 | Haigh et al. | |
| 6,922,080 B2 | 7/2005 | Haigh et al. | |
| 7,064,442 B1 | 6/2006 | Lane et al. | |
| 7,075,329 B2 | 7/2006 | Chen et al. | |

(Continued)

FOREIGN PATENT DOCUMENTS

| | | |
|---|---|---|
| JP | 5-10274 A | 1/1993 |
| JP | 2001521160 A | 11/2001 |

(Continued)

OTHER PUBLICATIONS

International Search Report for PCT/JP2010/000983 mailed Apr. 20, 2010.

*Primary Examiner* — Cuong Q Nguyen

(57) ABSTRACT

A semiconductor device according to the present invention includes: a first semiconductor substrate CHP1 including a control circuit that generates a control signal for a control target circuit, and a transmission circuit Tx that modulates the control signal to generate a transmission signal; a second semiconductor substrate CHP2 including a reception circuit Rx that demodulates the transmission signal transmitted from the transmission circuit to reproduce the control signal, and a drive circuit Drv that drives the control target circuit based on the control signal output from the reception circuit, the second semiconductor substrate CHP2 being electrically insulated from the first semiconductor substrate CHP1; an AC coupling element that is formed on a semiconductor substrate and couples the first semiconductor substrate CHP1 and the second semiconductor substrate CHP2 in an alternating manner; and a semiconductor package 20 including the first semiconductor substrate CHP1, the second semiconductor substrate CHP2, and the AC coupling element. This suppresses an increase in circuit area or mounting area.

26 Claims, 31 Drawing Sheets

(56) References Cited

U.S. PATENT DOCUMENTS

| | | |
|---|---|---|
| 7,302,247 B2 | 11/2007 | Dupuis |
| 2011/0057291 A1* | 3/2011 | Slupsky et al. ............... 257/531 |
| 2011/0254123 A1* | 10/2011 | Sellathamby et al. ........ 257/531 |
| 2012/0168901 A1* | 7/2012 | Santangelo et al. .......... 257/531 |

FOREIGN PATENT DOCUMENTS

| | | |
|---|---|---|
| JP | 2003523147 A | 7/2003 |
| JP | 2005080372 A | 3/2005 |
| JP | 2007252109 A | 9/2007 |
| WO | 2009035028 A | 3/2009 |

* cited by examiner

SEMICONDUCTOR DEVICE

TECHNICAL FIELD

The present invention relates to a semiconductor device, and more particularly, to a semiconductor device including a first semiconductor substrate and a second semiconductor substrate which communicate with each other through an AC coupling element based on different power supply voltages.

BACKGROUND ART

In general, a plurality of semiconductor chips or semiconductor packages are used to control a system incorporating a power transistor with a high breakdown voltage. In this regard, FIGS. 29 to 31 each show a block diagram of a semiconductor device that controls a power transistor PTr with a high breakdown voltage. In such a system as shown in FIGS. 29 to 31, a control circuit 101, which generates a control signal for the power transistor PTr, and a gate drive circuit 103, which drives the power transistor PTr, are connected via an insulating interface 102.

In order to adjust electric energy supplied to an electric motor, lighting equipment, or the like, the control circuit 101 generates a control signal for the power transistor PTr by means of pulse width modulation (PWM), for example. The control circuit 101 mainly includes a microcontroller, a PWM circuit, a timer circuit, a comparator, and an analog-to-digital conversion circuit. The gate drive circuit 103 detects a change in impedance of a reception-side phototransistor of a photocoupler, for example, to control the gate terminal of the power transistor PTr.

The insulating interface 102 includes an AC coupling element that couples the control circuit 101 and the gate drive circuit 103 in an alternating manner while electrically insulating them from each other, and transmits only necessary information such as a control signal. FIG. 29 shows a configuration in which a photocoupler used as the AC coupling element. FIG. 30 shows a configuration in which a magnetic coupler (for example, a transformer) used as the AC coupling element. FIG. 31 shows a configuration in which a capacitive coupler (for example, a capacitor) used as the AC coupling element. In the case where a transformer or a capacitor is used as the AC coupling element, a modulation circuit and a demodulation circuit are used to transmit signals through the AC coupling element. Patent Literatures 1 to 13 disclose an example in which a transformer is used as the insulating interface 102. Patent Literatures 3 and 14 disclose an example in which a capacitor is used as the insulating interface 102.

In FIGS. 29 to 31, semiconductor substrate areas are hatched and semiconductor package areas are surrounded by dashed lines. As shown in FIGS. 29 to 31, it is necessary to electrically insulate the circuits formed on, the control circuit 101 side from the circuits formed on the gate drive circuit 103 side. Accordingly, the insulating interface requires two semiconductor substrates, regardless of the coupler to be used. In other words, as shown in FIGS. 29 to 31, in the system configured using the insulating interface 102, the number of semiconductor substrates and the number of semiconductor packages are undesirably increased. Such a problem is evident when a motor drive control system or a lighting system is constructed using the insulating interface.

FIG. 32 shows a block diagram of a typical motor drive control system, and FIG. 33 shows a block diagram of a lighting system. The motor drive control system shown in FIG. 32 is a system for driving a three-phase electric motor. The system includes six power transistors PTr for driving the three-phase electric motor. A power supply circuit 110 for supplying high-voltage power is provided to the power transistors PTr. This power supply circuit 110 is an AC/DC conversion circuit that generates a DC power of 0 to 1 kV from AC power of 100 to 250 V. The power supply circuit 110 performs AC/DC conversion through a switching operation of the power transistors PTr. That is, it is necessary for the motor drive control system shown in FIG. 32 to control eight power transistors PTr. Thus, eight insulating interfaces 102 and eight gate drive circuits 103 are required according to the number of power transistors PTr. Accordingly, in the motor drive control system shown in FIG. 32, assuming that the number of the power transistors PTr to be controlled is represented by N, 2N+1 number of semiconductor packages and 3N+1 number of semiconductor substrates are required.

The lighting system shown in FIG. 33 includes a light-emitting diode serving as a lighting element 122. The lighting system shown in FIG. 33 has a function for adjusting an illuminance of the light-emitting diode. When a light-emitting diode is used as a light-emitting element, the illuminance thereof is proportional to a current flowing through the element. Accordingly, a method is employed in which the amount of current flowing through the light-emitting diode is controlled to a desired value. In the example shown in FIG. 33, a shunt resistor Rshunt for detecting a current flowing through the light-emitting diode is prepared to perform a negative feedback control so that a voltage generated in the shunt resistor Rshunt is set to a desired value. In the lighting system shown in FIG. 33, the insulating interface 102 is used to perform such a negative feedback control.

The control circuit 101 shown in FIG. 33 compares the voltage obtained from the shunt resistor Rshunt with an illuminance adjustment signal. Then, depending on the magnitude of the signal, the PWM circuit changes a duty ratio of a pulse signal. For example, when the voltage obtained from the shunt resistor Rshunt is lower than the voltage of the illuminance adjustment signal, the PWM circuit increases the duty ratio of the pulse signal (increases the pulse width). As a result, a voltage is applied to a primary coil of a transformer 121 for a longer time, and greater power is supplied from a secondary coil, so that the voltage obtained from the shunt resistor Rshunt increases. On the contrary, when the voltage obtained from the shunt resistor Rshunt is higher than the voltage of the illuminance adjustment signal, the PWM circuit decreases the duty ratio of the pulse signal (decreases the pulse width). As a result, the power supplied from the secondary coil of the transformer 121 decreases, and thus the voltage obtained from the shunt resistor Rshunt decreases. A power supply circuit 120 performs such a negative feedback control to thereby output a desired voltage.

At this time, in the lighting system, the control circuit 101, the insulating interface 102, and the gate drive circuit 103 are used to control a power MOS transistor PM based on a PWM signal. This is because a PWM control signal cannot be generated in a circuit having a high breakdown voltage due to its low operation speed and it is necessary to manufacture the gate drive circuit 103, which requires a high breakdown voltage, and the control circuit 101, which requires a high operation speed, by different processes. That is, also in the lighting system shown in FIG. 33, at least three semiconductor packages and four semiconductor substrates are required to control the power MOS transistor PM.

As shown in FIGS. 32 and 33, in the system that requires an insulating interface, the number of semiconductor substrates and the number of semiconductor packages are undesirably increased. In this regard, Patent Literature 15 proposes a hybrid IC having a configuration in which a pulse control circuit, a transformer, and a gate drive circuit are mounted in a single package. The use of this hybrid IC makes it possible to reduce the number of semiconductor packages of the system using an insulating interface.

CITATION LIST

Patent Literature

[Patent Literature 1] U.S. Pat. No. 4,785,345
[Patent Literature 2] U.S. Pat. No. 5,952,849
[Patent Literature 3] U.S. Pat. No. 6,249,171
[Patent Literature 4] U.S. Pat. No. 6,262,600
[Patent Literature 5] U.S. Pat. No. 6,525,566
[Patent Literature 6] U.S. Pat. No. 6,873,065
[Patent Literature 7] U.S. Pat. No. 6,903,578
[Patent Literature 8] U.S. Pat. No. 6,922,080
[Patent Literature 9] U.S. Pat. No. 7,064,442
[Patent Literature 10] U.S. Pat. No. 7,075,329
[Patent Literature 11] U.S. Pat. No. 7,302,247
[Patent Literature 12] Published Japanese Translation of PCT International Publication for Patent Application, No. 2001-521160
[Patent Literature 13] Published Japanese Translation of PCT International Publication for Patent Application, No. 2003-523147
[Patent Literature 14] U.S. Pat. No. 4,780,795
[Patent Literature 15] Japanese Unexamined Patent Application Publication No. 2005-080372

SUMMARY OF INVENTION

Technical Problem

However, a pulse transformer mounted in the hybrid IC disclosed in Patent Literature 15 cannot be formed on a chip. This causes a problem of an increase in the size of the semiconductor package including the pulse transformer. Furthermore, the pulse transformer has a large volume, which makes it difficult to encapsulate a plurality of pulse transformers in a single semiconductor package. That is, in the case of driving two or more power transistors, the number of hybrid ICs increases with an increase in the number of power transistors.

When the pulse transformer is replaced with an on-chip transformer, the amplitude of a signal transmitted to a reception-side chip decreases due to a low coupling coefficient of the transformer, or a low-frequency signal cannot be propagated due to a small inductance of the on-chip transformer, which makes it difficult to sufficiently ensure the pulse width of the pulse signal transmitted to the reception-side chip. Thus, the hybrid IC disclosed in Patent Literature 15 has a problem of difficulty in transmitting the pulse signal with which a gate driver composed of a transistor having a high breakdown voltage can fully operate.

In other words, the use of the hybrid IC disclosed in Patent Literature 15 is not enough to sufficiently reduce the circuit area or mounting area of a semiconductor device including an insulating interface, while securing the reliability of operation.

In view of the above-mentioned problems, the present invention aims to reduce the circuit area or mounting area of a semiconductor device including an insulating interface, while securing the reliability of operation.

Solution to Problem

A semiconductor device according to the present invention includes: a first semiconductor substrate including: a control circuit that generates a control signal for a control target circuit; and a transmission circuit that modulates the control signal to generate a transmission signal; a second semiconductor substrate including: a reception circuit that demodulates the transmission signal transmitted from the transmission circuit to reproduce the control signal; and a drive circuit that drives the control target circuit based on the control signal output from the reception circuit, the second semiconductor substrate being electrically insulated from the first semiconductor substrate; an AC coupling element that is formed on a semiconductor substrate and couples the first semiconductor substrate and the second semiconductor substrate in an alternating manner; and a semiconductor package including the first semiconductor substrate, the second semiconductor substrate, and the AC coupling element mounted therein.

Advantageous Effects of Invention

According to the present invention, it is possible to reduce the circuit area or mounting area of a semiconductor device including an insulating interface, while securing the reliability of operation.

DESCRIPTION OF EMBODIMENTS

First Exemplary Embodiment

Figure 1:
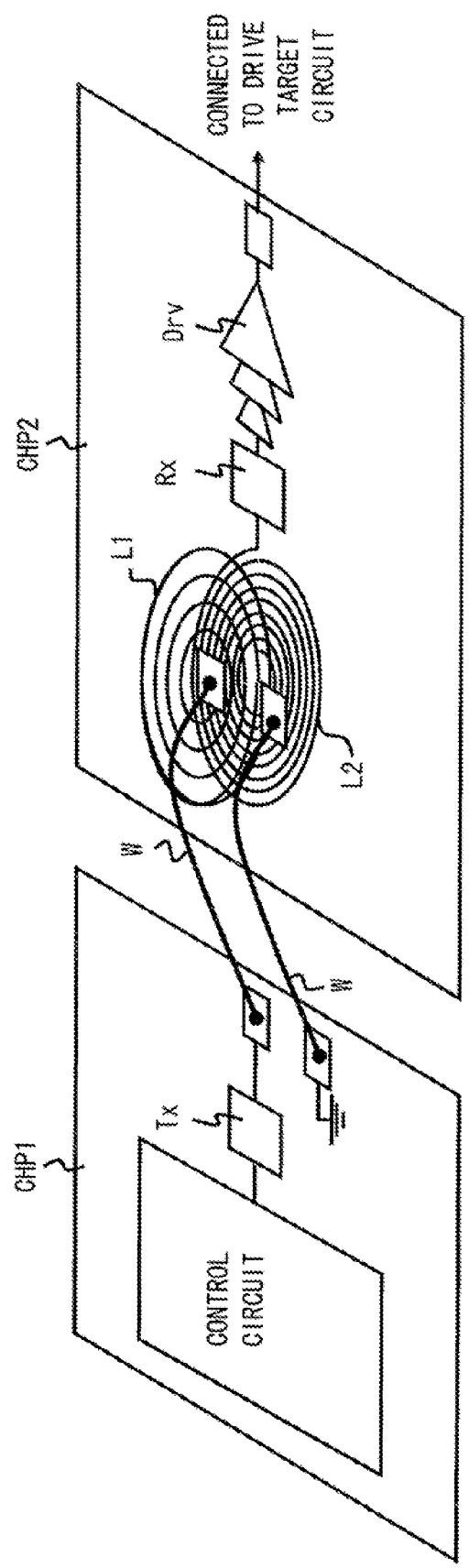
FIG. 1 is a schematic view showing a mounted state of a semiconductor device according to a first exemplary embodiment.

Exemplary embodiments of the present invention will be described below with reference to the drawings. FIG. 1 shows a schematic view illustrating a mounted state of a semiconductor device according to this exemplary embodiment. As shown in FIG. 1, the semiconductor device according to this exemplary embodiment includes a first semiconductor substrate CHP1 and a second semiconductor substrate CHP2. The first semiconductor substrate CHP1 and the second semiconductor substrate CHP2 are mounted in a single semiconductor package.

The first semiconductor substrate CHP1 includes a control circuit and a transmission circuit Tx. The second semiconductor substrate CHP2 includes a reception circuit Rx and a gate drive circuit Drv. In the example shown in FIG. 1, the second semiconductor substrate CHP2 includes an AC coupling element (for example, a transformer). The transformer includes a primary coil L1 and a secondary coil L2. The secondary coil L2 is connected to an output of the transmission circuit Tx, which is formed on the first semiconductor substrate CHP1, through a pad and wire bonding. This transformer functions as an insulating interface in the semiconductor device of this exemplary embodiment. In this exemplary embodiment, an AC coupling element (for example, a transformer or a capacitor) is used as the insulating interface. The transformed formed on the semiconductor substrate is referred to as an "on-chip transformer" as needed, and the capacitor formed on the semiconductor device is referred to as an "on-chip capacitor" as needed.

First, a process for manufacturing the first semiconductor substrate CHP1 and the second semiconductor substrate CHP2 will be described. The first semiconductor substrate CHP1 is manufactured by a process different from that of the second semiconductor substrate CHP2. The first semiconductor substrate CHP1 is manufactured by a finer process than that of the second semiconductor substrate CHP2. This enables reduction in chip area of the first semiconductor substrate CHP1, resulting in lower manufacturing cost and power consumption.

The second semiconductor substrate CHP2 requires a breakdown voltage of about 5 V to 15 V for driving the gate terminal of a power transistor. This makes it difficult to employ a fine process with a minimum dimension of about 0.13 µm, for example. Accordingly, the second semiconductor substrate CHP2 may be manufactured by a previous-generation manufacturing process using minimum dimensions of about 0.5 µm or more with a withstand voltage higher than that of the first semiconductor substrate. The gate drive circuit Drv and passive elements such as a transformer and a capacitor are mainly formed on the second semiconductor substrate CHP2. Even by the employment of a finer semiconductor manufacturing process, it is difficult to reduce the area occupied by such circuits and elements. The circuits and elements inevitably occupy a certain area, independently of the degree of fineness of the manufacturing process. For this reason, the circuits and elements are formed on the second semiconductor substrate CHP2 manufactured by a previous-generation manufacturing process, thereby reducing the effect of an increase in chip area.

The reception circuit Rx and the gate drive circuit Drv are formed on the second semiconductor substrate CHP2. The gate drive circuit Drv may require a breakdown voltage of about 15 V. Meanwhile, the use of a transistor having a breakdown voltage of 15 V to constitute the reception circuit Rx has such disadvantages as increases in circuit area and power consumption and decreases in operating frequency and sensitivity of an amplifier or the like. Accordingly, in the second semiconductor substrate CH2 according to this exemplary embodiment, the operating voltage of the reception circuit Rx is set to be lower than the operating voltage of the gate drive circuit Drv. In other words, a transistor having a shorter gate length and a thinner gate insulating film than those of a circuit element (for example, a MOS transistor) constituting the gate drive circuit Drv is used as a circuit element (for example, a MOS transistor) constituting the reception circuit Rx. This makes it possible to reduce the circuit area and power consumption of the reception circuit Rx and improve the receiving sensitivity. For example, the reception circuit Rx is formed of a transistor having a minimum gate length of 0.5 µm and a gate insulating film breakdown voltage of 5 V, and the gate drive circuit Drv is formed of a transistor having a minimum gate length of 1.2 µm and a gate insulating film breakdown voltage of 15 V of. The reception circuit Rx is configured to operate at a power supply voltage of 5 V, and the gate drive circuit Drv is configured to operate at a power supply voltage of 15 V. At this time, although not illustrated in FIG. 1, a level shifter is disposed between the reception circuit Rx and the gate drive circuit Drv so as to eliminate an amplitude difference between a signal transmitted by the reception circuit Rx and a signal transmitted by the gate drive circuit Drv.

An on-chip transformer is formed on the second semiconductor substrate CHP2. In this exemplary embodiment, each of the power supply voltage and the signal amplitude of the transmission circuit Tx of the first semiconductor substrate CHP1 is 1.0 V, and each of the power supply voltage and the signal amplitude of the reception circuit Rx on the second semiconductor substrate CHP2 is 5 V. Accordingly, in this exemplary embodiment, the inductance ratio of the transformer is adjusted to convert the voltage into such a voltage as to be easily transmitted and received between these two circuits. For example, assume that the primary coil L1 connected to the transmission circuit Tx has an inductance of 10 nH, and the secondary coil L2 connected to the reception circuit Rx has an inductance of 50 nH. Thus, a signal having an amplitude of 1.0 V, which is output from the transmission circuit Tx, can be converted into a signal having an amplitude of 5.0 V through the transformer, and can be input to the reception circuit Rx. This permits reliable signal transmission even when the first semiconductor substrate CHP1 and the second semiconductor substrate CHP2 are manufactured by manufacturing processes with different breakdown voltages. In the case of transmitting a signal from a circuit operating at a high power supply voltage to a circuit operating at a low power supply voltage, the amplitude level of the signal is converted in the transformer based on the inductance ratio, thereby preventing an excessively large voltage from being applied to the reception circuit. This prevents the reception circuit operating at a low power supply voltage from being broken.

Figure 2:
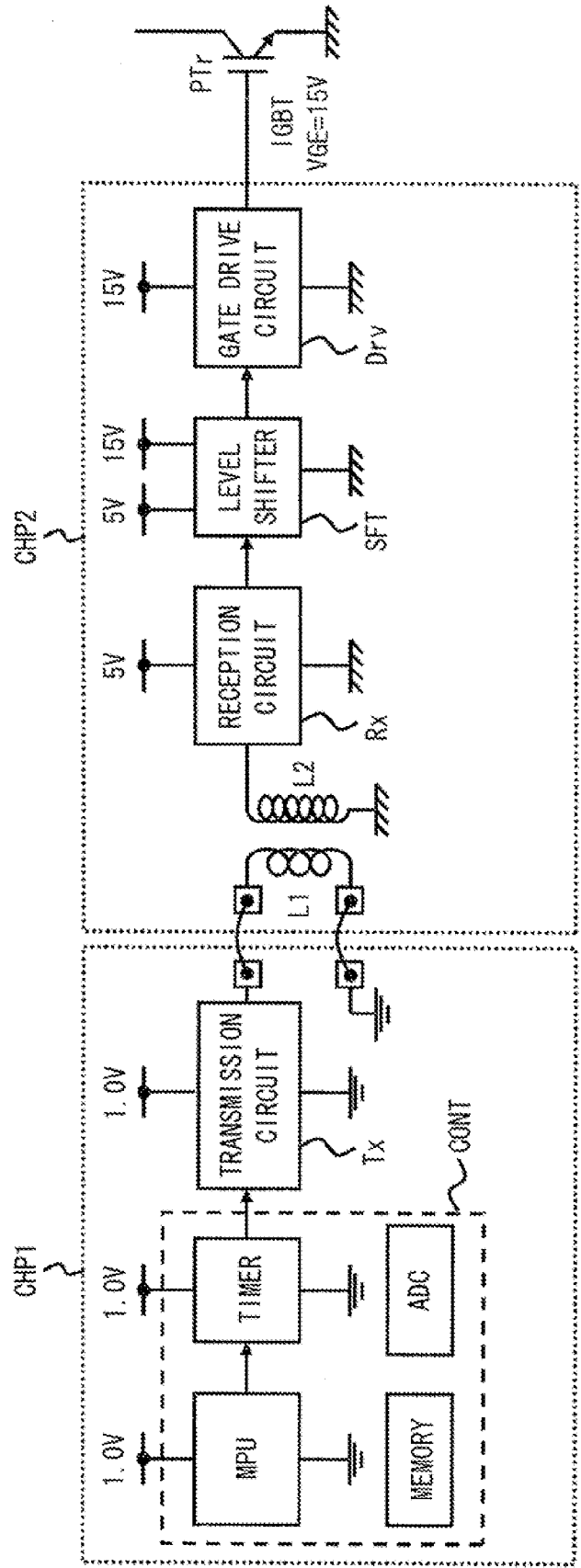
FIG. 2 is a block diagram of the semiconductor device according to the first exemplary embodiment.

Subsequently, circuits for use in the semiconductor device according to this exemplary embodiment will be described. FIG. 2 shows a detailed block diagram of the semiconductor device according to this exemplary embodiment. As shown in FIG. 2, in the semiconductor device according to this exemplary embodiment, a control circuit CONT and the transmission circuit Tx are mounted on the first semiconductor substrate CHP1. The on-chip transformer (composed of the primary coil L1 and the secondary coil L2), the reception circuit Rx, a level shifter SFT, and the gate drive circuit Drv are mounted on the second semiconductor substrate CHP2.

First, the circuits mounted on the first semiconductor substrate CHP1 will be described. The control circuit CONT generates a control signal for controlling a control target circuit (a power transistor PTr in this exemplary embodiment). The transmission circuit Tx modulates the control signal, which is output by the control circuit CONT, to generate a transmission signal. The transmission circuit Tx then drives the primary coil L1 using the transmission signal. In this exemplary embodiment, the control circuit CONT and the transmission circuit Tx operate based on a power supply voltage of 1.0 V.

Figure 3:
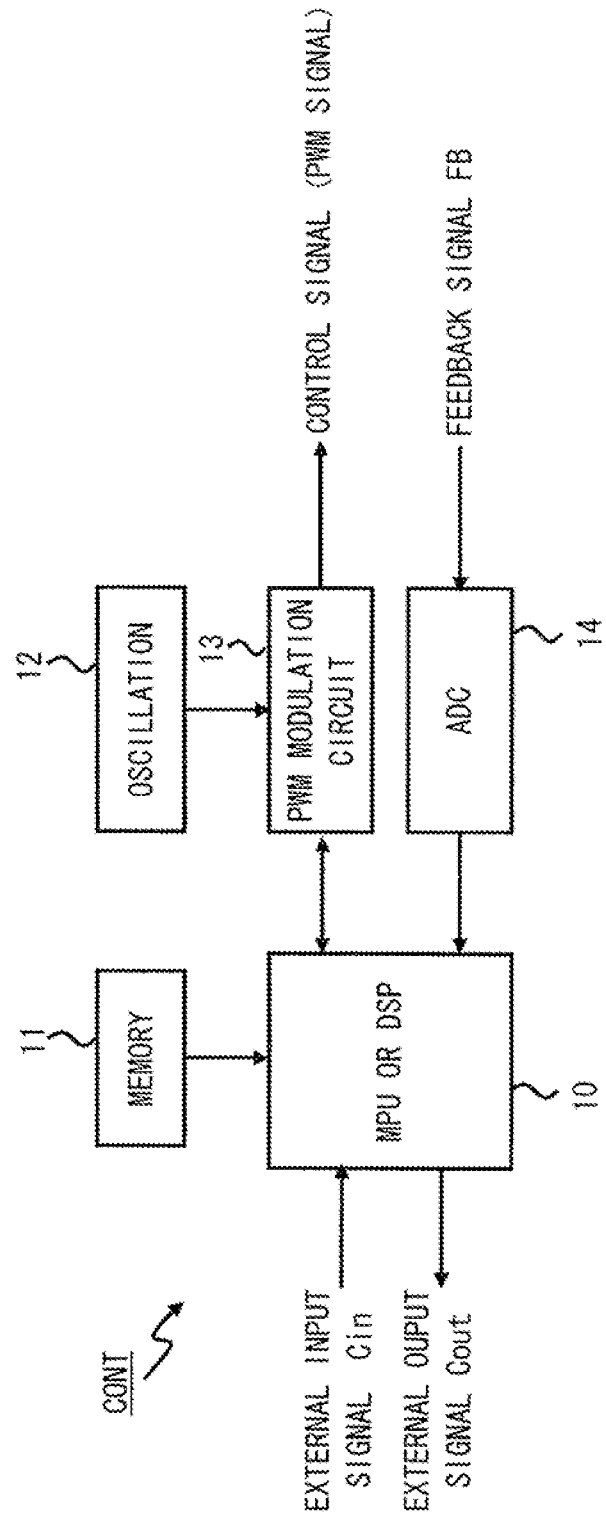
FIG. 3 is a block diagram of a control circuit according to the first exemplary embodiment.

The control circuit CONT will be described in more detail. FIG. 3 shows a block diagram of the control circuit CONT. As shown in FIG. 3, the control circuit CONT includes an arithmetic circuit (MPU (Multi Processing Unit) or DSP (Digital Signal Processor)) 10, a memory 11, an oscillation circuit 12, a PWM circuit 13, and an ADC (Analog Digital Converter) 14. The arithmetic circuit 10 performs rotation control for a motor or an output control for lighting, for example. The memory 11 stores programs for use in the arithmetic circuit 10. The PWM circuit 13 generates a control signal subjected to PWM by converting a digital signal, which is represented by binary code or the like output from the arithmetic circuit 10, into a pulse width modulated signal. The oscillation circuit 12 generates a saw-tooth wave or a chopping wave for use in the PWM processing, and supplies the generated wave to the PWM circuit 13. The ADC 14 converts a feedback signal (analog signal), which is obtained from a motor or other circuit, into a digital value to be transmitted to the arithmetic circuit 10. The arithmetic circuit 10 performs a control operation based on an input signal from an external operation switch and signals fed back from a rotation sensor, a phase detection sensor, a current sensor, and a voltage sensor of an electric motor, or from a current sensor and an illuminance sensor of lighting equipment, for example. The configuration of the control circuit CONT can be appropriately changed depending on the configuration of a control target circuit or other system.

Next, the circuits mounted on the second semiconductor substrate CHP2 will be described. The transformer is composed of the primary coil L1 and the secondary coil L2. The reception circuit Rx receives the pulse signal, which is obtained through the transformer, demodulates the pulse signal to thereby reproduce the control signal input to the transmission circuit Tx, transmits the control signal to a subsequent-stage circuit. The reception circuit Rx operates based on a power supply of 5 V, for example.

Figure 4:
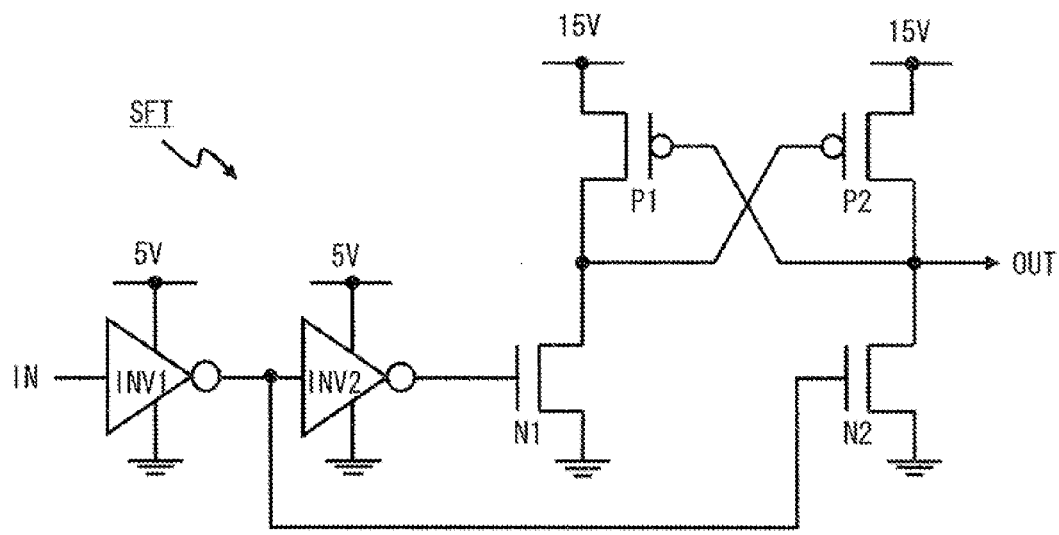
FIG. 4 is a block diagram of a level shifter according to the first exemplary embodiment.

The level shifter SFT converts the amplitude of the control signal output by the reception circuit Rx into an amplitude based on the power supply voltage of the gate drive circuit Drv. The level shifter SFT then outputs the converted control signal to the gate drive circuit Drv. FIG. 4 shows a detailed circuit diagram of the level shifter SFT.

As shown in FIG. 4, the level shifter SFT includes inverters INV1 and INV2, NMOS transistors N1 and N2, and PMOS transistors P1 and P2. The inverters INV1 and INV2 operate based on a power supply voltage of 5 V. The inverter INV1 receives the output signal of the reception circuit Rx as an input signal IN, inverts the input signal IN, and outputs the inverted signal. The inverter INV2 inverts the output of the inverter INV1 and outputs the inverted signal. The source of the NMOS transistor N1 is connected to a ground terminal, and the drain of the NMOS transistor N1 is connected to the drain of the PMOS transistor P1. The gate of the NMOS transistor N1 is supplied with the output signal of the inverter INV2. The source of the NMOS transistor N2 is connected to the ground terminal, and the drain of the NMOS transistor N2 is connected to the drain of the PMOS transistor P2. The gate of the NMOS transistor N2 is supplied with the output signal of the inverter INV1. The PMOS transistors P1 and P2 are cross-coupled transistors. The sources of the PMOS transistors P1 and P2 are connected to a power supply voltage (15 V). With this circuit configuration, the level shifter SFT converts a signal having an amplitude corresponding to an input-side power supply voltage (for example, 5 V) into a signal having an amplitude corresponding to an output-side power supply voltage (for example, 15 V).

The gate drive circuit Drv drives the power transistor PTr based on the control signal obtained through the reception circuit Rx and the level shifter SFT. In this exemplary embodiment, the gate drive circuit Drv operates based on a power supply voltage of 15 V. The gate drive circuit Drv is a driver having large current supply ability for driving the gate of the power transistor PTr. The gate drive circuit Drv may have a configuration including an open-drain type or a pushpull type output stage, for example. The gate drive circuit Drv preferably has an output current or sink current of 10 mA or more.

Figure 5:
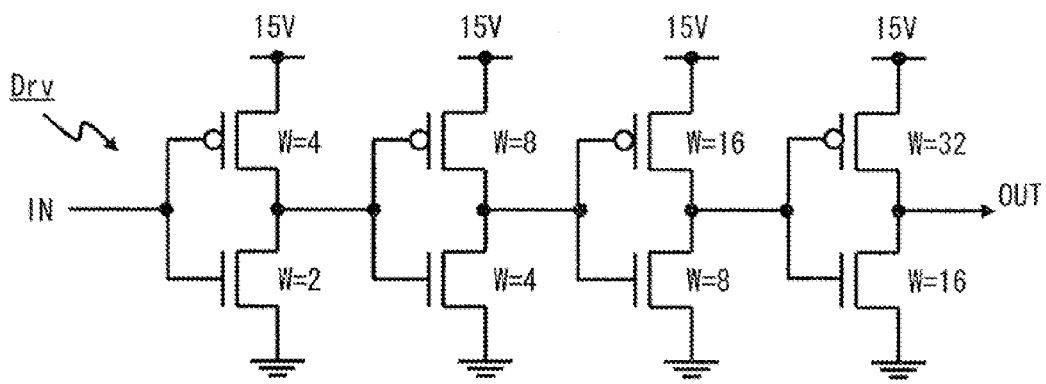
FIG. 5 is a block diagram of a gate drive circuit according to the first exemplary embodiment.

Now, an exemplary circuit of the gate drive circuit Drv will be described. FIG. 5 shows a circuit diagram of the gate drive circuit Drv. As shown in FIG. 5, the gate drive circuit Drv includes a plurality of inverters each including a PMOS transistor and an NMOS transistor which are connected in series between the power supply terminal and the ground terminal. Gate widths "w" of the transistors increase as approaching the subsequent stage. This is because if a transistor with low driving ability (for example, a transistor having a small gate width "w") drives a transistor having a large gate width "w", the drive target transistor cannot be driven due to a gate parasitic capacitance of the drive target transistor. As shown in FIG. 5, the transistors (or inverters) are arranged so that the gate widths "w" thereof gradually increase, thereby preventing such a malfunction from occurring.

Figure 6:
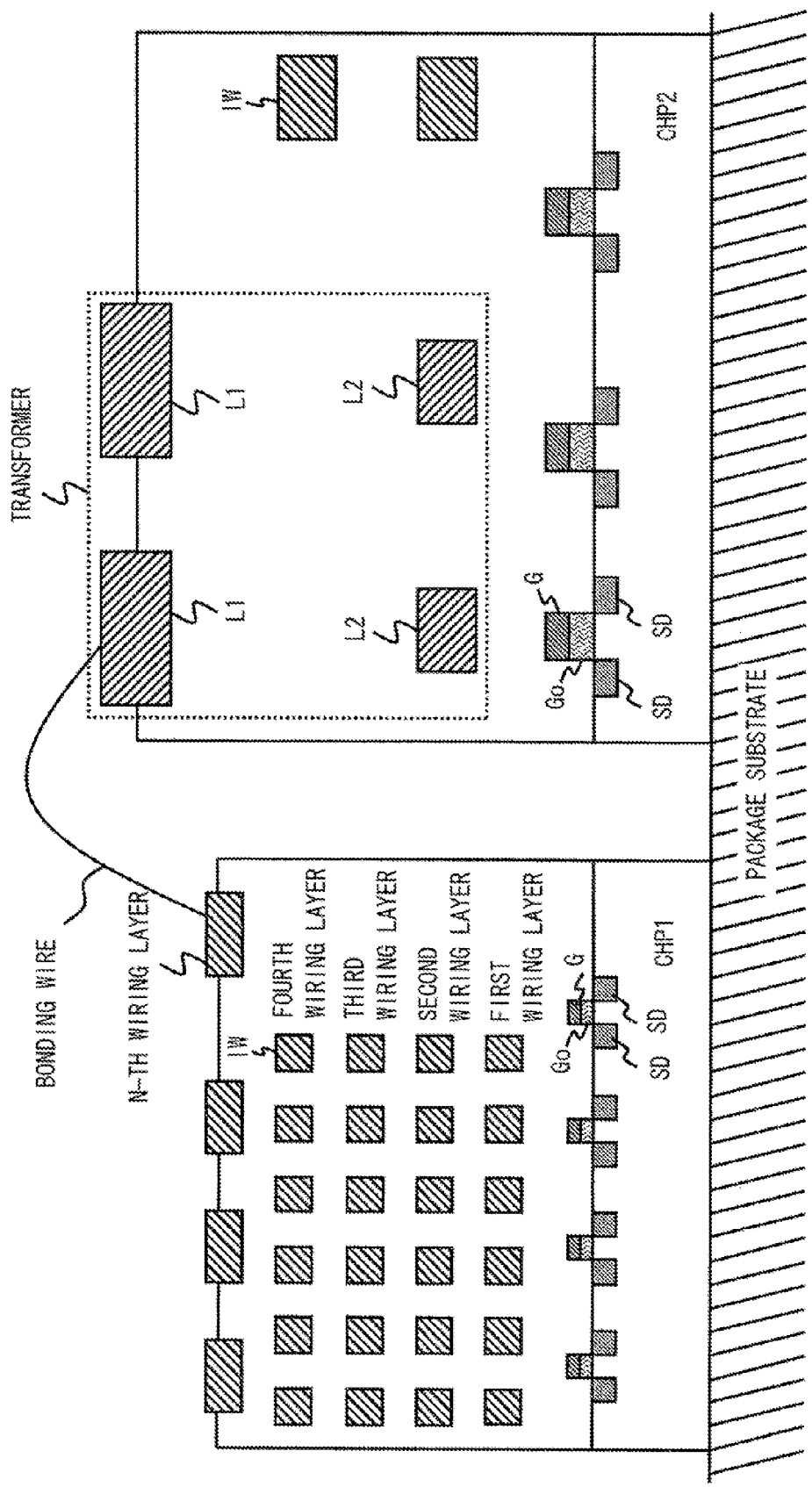
FIG. 6 is a schematic sectional view of semiconductor substrates constituting the semiconductor device according to the first exemplary embodiment.

Subsequently, processes for manufacturing the first semiconductor substrate CHP1 and the second semiconductor substrate CHP2 which constitute the semiconductor device according to this exemplary embodiment will be described in detail. FIG. 6 shows a schematic sectional view of the first semiconductor substrate CHP1 and the second semiconductor substrate CHP2 which constitute the semiconductor device according to this exemplary embodiment.

As described above, the control circuit CONT is formed on the first semiconductor substrate CHP1. The control circuit CONT includes a complicated logic circuit such as an arithmetic circuit (for example, MPU or DSP). Accordingly, the first semiconductor substrate CHP1 is preferably manufactured by a manufacturing process with a higher degree of integration so as to produce a large effect of reducing the chip area. The first semiconductor substrate CHP1 is preferably manufactured by a manufacturing process with a larger number of wiring layers. This may reduce the chip area and costs. That is, the use of a CMOS process with a minimum gate dimension of 0.25 µm enables further reduction in chip area as compared with a CMOS process with a minimum gate dimension of 0.5 µm. Further, the use of a CMOS process involving four wiring layers enables further reduction in chip area as compared with a CMOS process involving two wiring layers.

On the other hand, the second semiconductor substrate CHP2 is manufactured by a manufacturing process capable of forming a transistor with a higher breakdown voltage than that of the first semiconductor substrate CHP1. In many cases, it is generally necessary to apply a gate voltage of 5 V to 15 V to an insulated gate bipolar transistor (IGBT) or a power transistor which controls ON/OFF of a voltage of several hundred volts. Meanwhile, a semiconductor integrated circuit for a typical logic circuit constituting the control circuit CONT and the like operates at a power supply voltage of 5 V or lower. Thus, if a voltage higher than 5 V is applied to a gate insulating film or the like, breakdown is more likely to occur. Accordingly, the second semiconductor substrate CHP2 needs to be formed by a manufacturing process resistant to a breakdown voltage of at least 5 V or higher, and more preferably, 15 V or higher. Therefore, in this exemplary embodiment, the second semiconductor substrate CHP2 is formed by a manufacturing process with a higher withstand voltage than that of the first semiconductor substrate CHP1.

More specifically, as shown in FIG. 6, a gate insulating film Go of a transistor formed on the second semiconductor substrate CHP2 has a thickness greater than that of a transistor formed on the first semiconductor substrate CHP1. The gate length of the transistor, which is determined by an interval between source and drain regions SD of the transistor formed on the second semiconductor substrate CHP2 is longer than that of the transistor formed on the first semiconductor substrate CHP1.

A line IW of the second semiconductor substrate CHP2 also requires a higher withstand voltage than a line IW of the first semiconductor substrate CHP1. Thus, as shown in FIG. 6, the line interval on the second semiconductor substrate CHP2 is set to be larger than the line interval on the first semiconductor substrate CHP1. The thickness of an insulating film formed between wiring layers of the second semiconductor substrate CHP2 is set to be greater than that of an insulating film formed between wiring layers of the first semiconductor substrate CHP1. The gate drive circuit Drv of the second semiconductor substrate CHP2 needs to supply a large current of several tens of milliamperes to several hundreds of milliamperes at maximum to the gate terminal of the IGBT or the power transistor. This necessitates the use of the line IW resistant to the passage of a large current. Thus, the line width of the second semiconductor substrate CHP2 is set to be greater than that of the first semiconductor substrate CHP1. The wiring layer thickness of the second semiconductor substrate CHP2 is set to be greater than that of the first semiconductor substrate CHP1. Since no complicated circuit is formed on the second semiconductor substrate CHP2, the number of wiring layers of the second semiconductor substrate CHP2 can be set to be smaller than that of the first semiconductor substrate CHP1.

Now, a description is made of a modified example of a method for mounting a transformer in the semiconductor device according to this exemplary embodiment. In the semiconductor device according to this exemplary embodiment, the AC coupling element is formed using two coils formed on one or two semiconductor chips. The AC coupling element according to this exemplary embodiment is preferably formed on a semiconductor substrate, but may be formed in various modes. FIGS. 7 to 11 and FIGS. 13 to 23 each show a schematic view of a mounted state of the AC coupling element in the semiconductor device according to this exemplary embodiment. Assume hereinafter that the transmission circuit Tx includes other circuits (for example, the control circuit CONT) on the first semiconductor substrate and that the reception circuit Rx includes other circuits (for example, the level shifter SFT and the gate drive circuit Drv) on the second semiconductor substrate.

Figure 7:
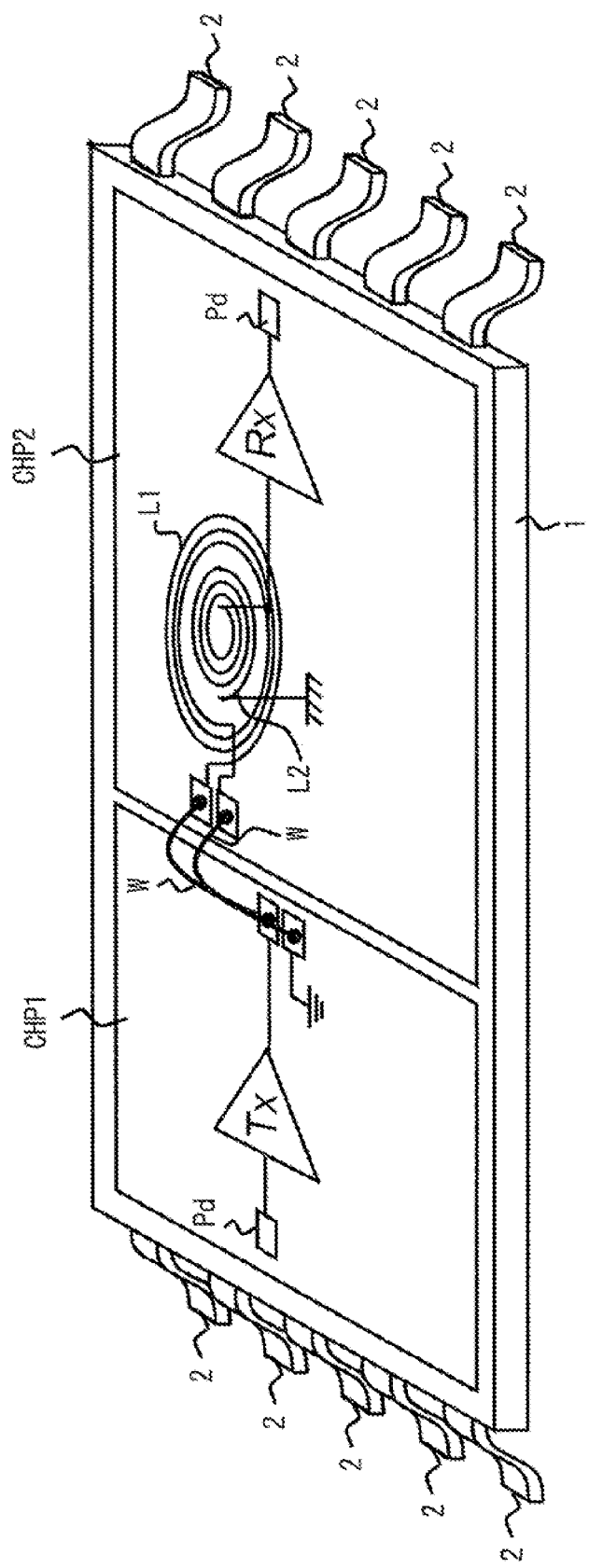
FIG. 7 is a schematic view showing a mounted state of the semiconductor device according to the first exemplary embodiment.

In the mounted state shown in FIG. 7, the first semiconductor substrate CHP1 and the second semiconductor substrate CHP2 are mounted in a semiconductor package 1. Each of the first semiconductor substrate CHP1 and the second semiconductor substrate CHP2 includes a pad Pd. The pads Pd of the first semiconductor chip 1 and the second semiconductor chip 2 are connected to lead terminals 2 which are provided in the semiconductor package 1 through bonding wires that are not shown. This configuration is common to the mounting modes shown in FIGS. 8 to 11 and FIGS. 13 to 23.

In the amounted state shown in FIG. 7, the transmission circuit Tx is formed on the first semiconductor substrate CHP1. The primary coil L1, the secondary coil L2, and the reception circuit Rx are formed on the second semiconductor substrate CHP2. A pad connected to the transmission circuit Tx is formed on the first semiconductor substrate CHP1, and a pad connected to the primary coil L1 is formed on the second semiconductor substrate CHP2. The transmission circuit Tx is connected to one end of the primary coil L1, which is formed on the second semiconductor substrate CHP2, through the pad and a bonding wire W. The other end of the primary coil L1 is connected to a ground line on the side of the transmission circuit Tx through the pad and the bonding wire W which are formed on the first semiconductor substrate CHP1.

Figure 8:
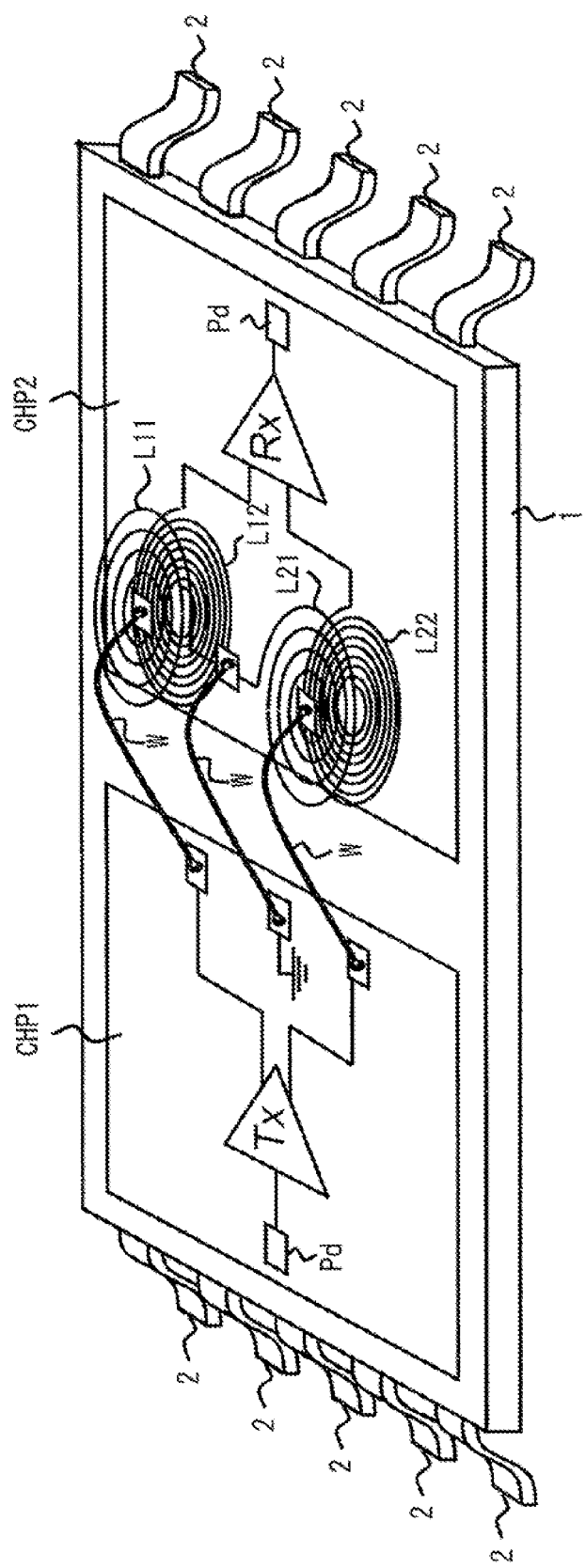
FIG. 8 is a schematic view showing a mounted state of the semiconductor device according to the first exemplary embodiment.

In the mounting example shown in FIG. 8, two transformers are provided on the side of the second semiconductor substrate CHP2. The two transformers include a first transformer having a first primary coil L11 and a first secondary coil L12, and a second transformer having a second primary coil L21 and a second secondary coil L22. One terminal of each of the first primary coil L11 and the second primary coil L21 is connected to the ground line of the transmission circuit Tx which is supplied with a second ground voltage GND2, and the other terminal thereof is connected to the corresponding transmission node of the transmission circuit Tx. One terminal of each of the first secondary coil L12 and the second secondary coil L22 is connected to the ground line of the reception circuit Tx which is supplied with a first ground voltage GND1, and the other terminal thereof is connected to the corresponding reception node of the reception circuit Rx.

Figure 9:
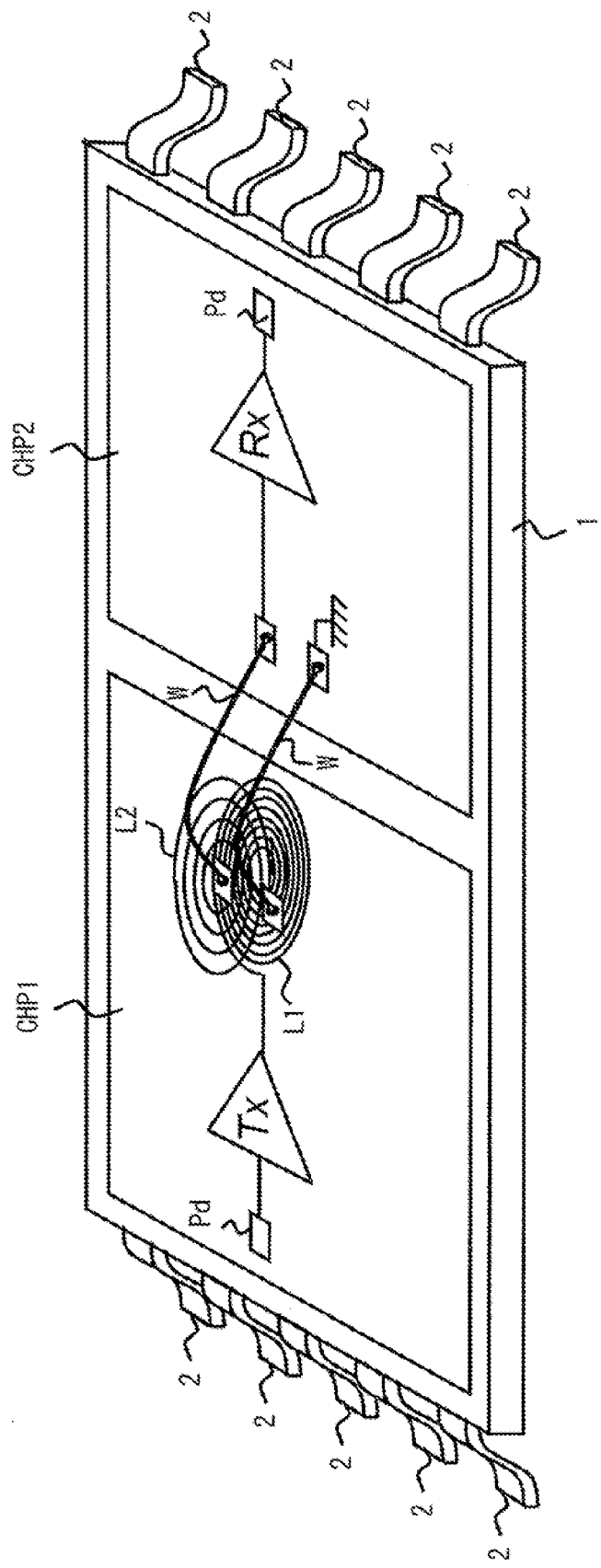
FIG. 9 is a schematic view showing a mounted state of the semiconductor device according to the first exemplary embodiment.

In the mounted state shown in FIG. 9, the primary coil L1, the secondary coil L2, and the transmission circuit Tx are formed on the first semiconductor substrate CHP1. Meanwhile, the reception circuit Rx is formed on the second semiconductor substrate CHP2. A pad connected to the secondary coil L2 is formed on the first semiconductor substrate CHP1, and a pad connected to the reception circuit Rx is formed on the second semiconductor substrate CHP2. The reception circuit Rx is connected to one end of the secondary coil L2, which is formed above the first semiconductor substrate CHP1, through the pad and the bonding wire W. The secondary coil L2 is connected to the ground line on the side of the reception circuit Rx through the pad and the bonding wire which are formed on the second semiconductor substrate CHP2. In the examples shown in FIGS. 1 and 9, the primary coil L1 and the secondary coil L2 are formed using a first wiring layer and a second wiring layer which are vertically stacked within one semiconductor chip.

Figure 10:
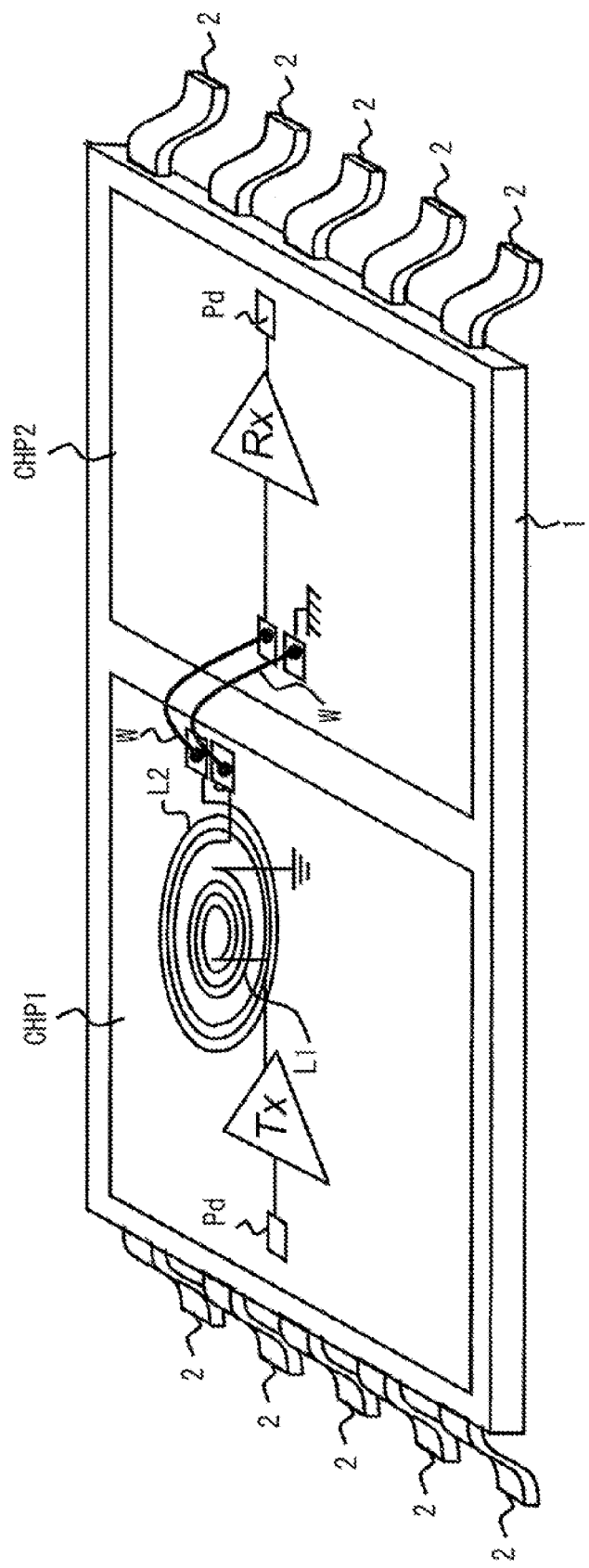
FIG. 10 is a schematic view showing a mounted state of the semiconductor device according to the first exemplary embodiment.

In the mounted state shown in FIG. 10, the primary coil L1, the secondary coil L2, and the transmission circuit Tx are formed on the first semiconductor substrate CHP1. The reception circuit Rx is formed on the second semiconductor substrate CHP2. A pad connected to the secondary coil L2 is formed on the first semiconductor substrate CHP1, and a pad connected to the reception circuit Rx is formed on the second semiconductor substrate CHP2. The reception circuit Rx is connected to one end of the secondary coil L2, which is formed on the first semiconductor substrate CHP1, through the pad and the bonding wire W. The other end of the primary coil L1 is connected to the ground line on the side of the reception circuit Rx through the pad and the bonding wire W which are formed on the second semiconductor substrate CHP2. In the examples shown in FIGS. 7 and 10, the primary coil L1 and the secondary coil L2 are formed in a single wiring layer on a single semiconductor substrate. The primary coil L1 and the secondary coil L2 are formed as coils having the same center position.

Figure 11:
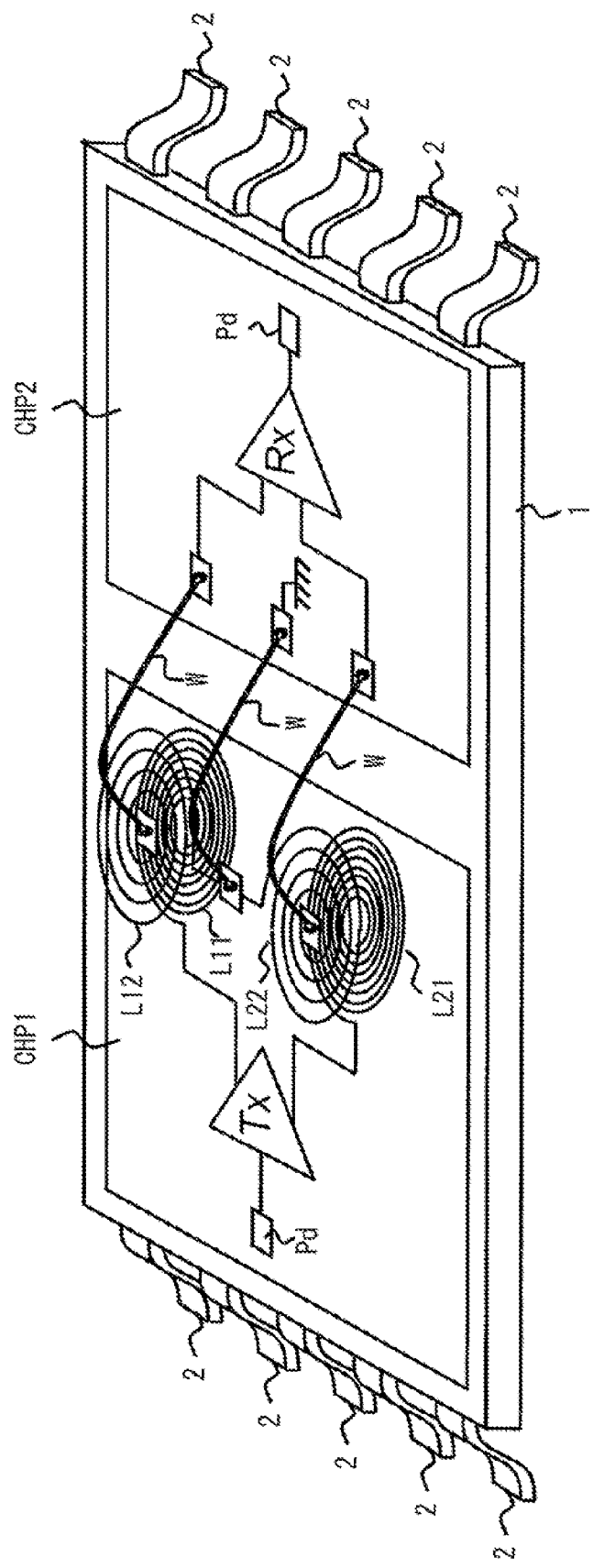
FIG. 11 is a schematic view showing a mounted state of the semiconductor device according to the first exemplary embodiment.

In the mounting example shown in FIG. 11, two transforms are provided on the first semiconductor substrate CHP1. The two transformers include the first transformer having the first primary coil L11 and the first secondary coil L12, and the second transformer having the second primary coil L21 and the second secondary coil L22. One terminal of each of the first primary coil L11 and the second primary coil L21 is connected to the ground line of the transmission circuit Tx which is supplied with the second ground voltage GND2, and the other terminal thereof is connected to the corresponding transmitting node of the transmission circuit Tx. One terminal of each of the first secondary coil L12 and the second secondary coil L22 is connected to the ground line of the reception circuit Rx which is supplied with the first ground voltage GND1, and the other terminal thereof is connected to the corresponding reception node of the reception circuit Rx.

Figure 12:
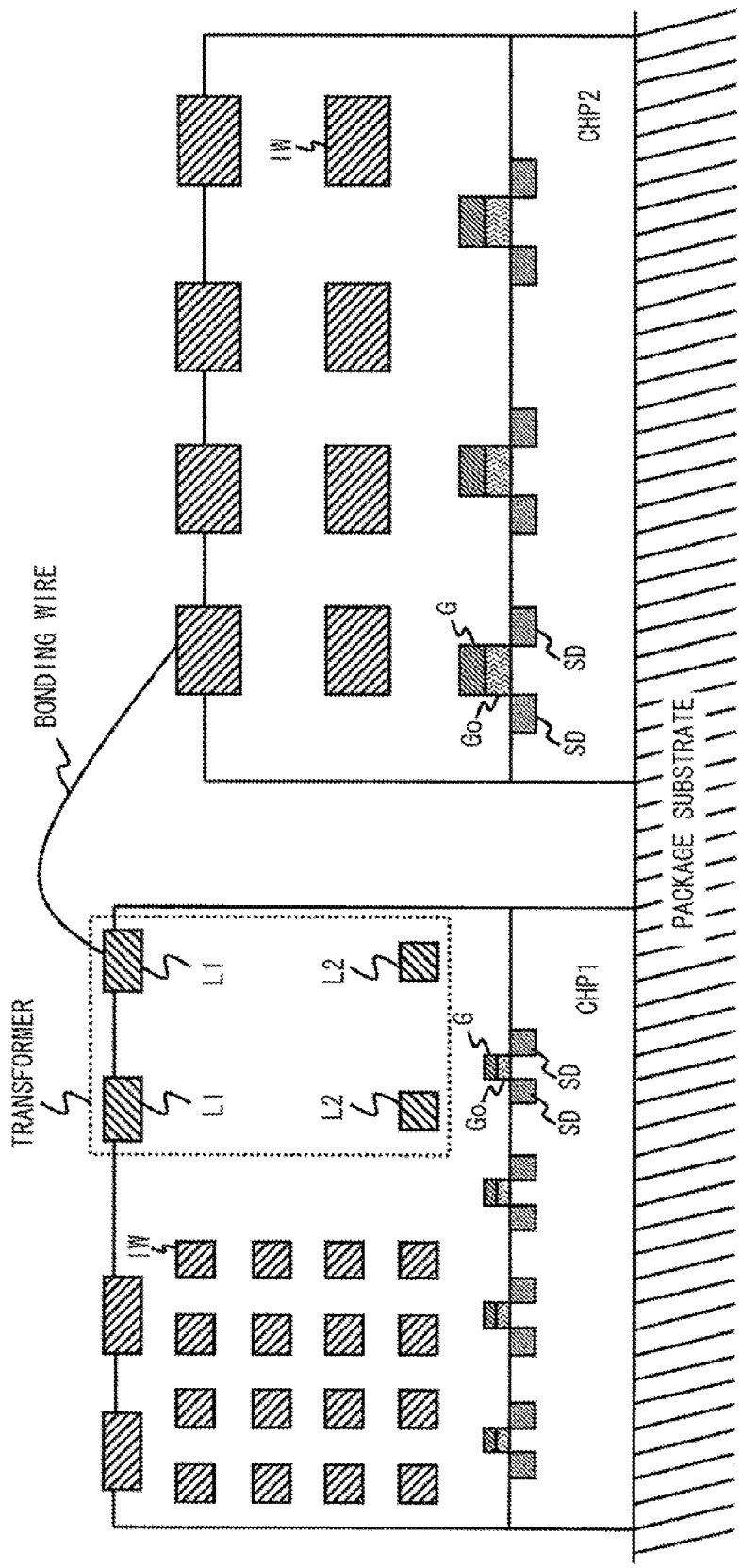
FIG. 12 is a schematic sectional view of semiconductor substrates constituting the semiconductor device shown in FIGS. 10 and 11.

In the mounting examples shown in FIGS. 9 to 11, the transformers are formed on the first semiconductor substrate CHP. Such a mounting mode is effective when the total number of wiring layers of the second semiconductor substrate CHP2 is small. FIG. 12 shows a schematic sectional view of the first semiconductor substrate CHP1 and the second semiconductor substrate CHP2 when the mounting modes shown in FIGS. 9 to 11 are employed. As shown in FIG. 12, in this case, the number of wiring layers of the second semiconductor substrate CHP2 is too small to obtain a sufficient thickness of an interlayer insulating film formed between the primary coil L1 and the secondary coil L2. For this reason, the transformers are formed on the first semiconductor substrate CHP1 where a thick interlayer insulating film can be secured. As a result, a sufficient withstand voltage between the primary coil L1 and the secondary coil L2 can be secured.

Figure 13:
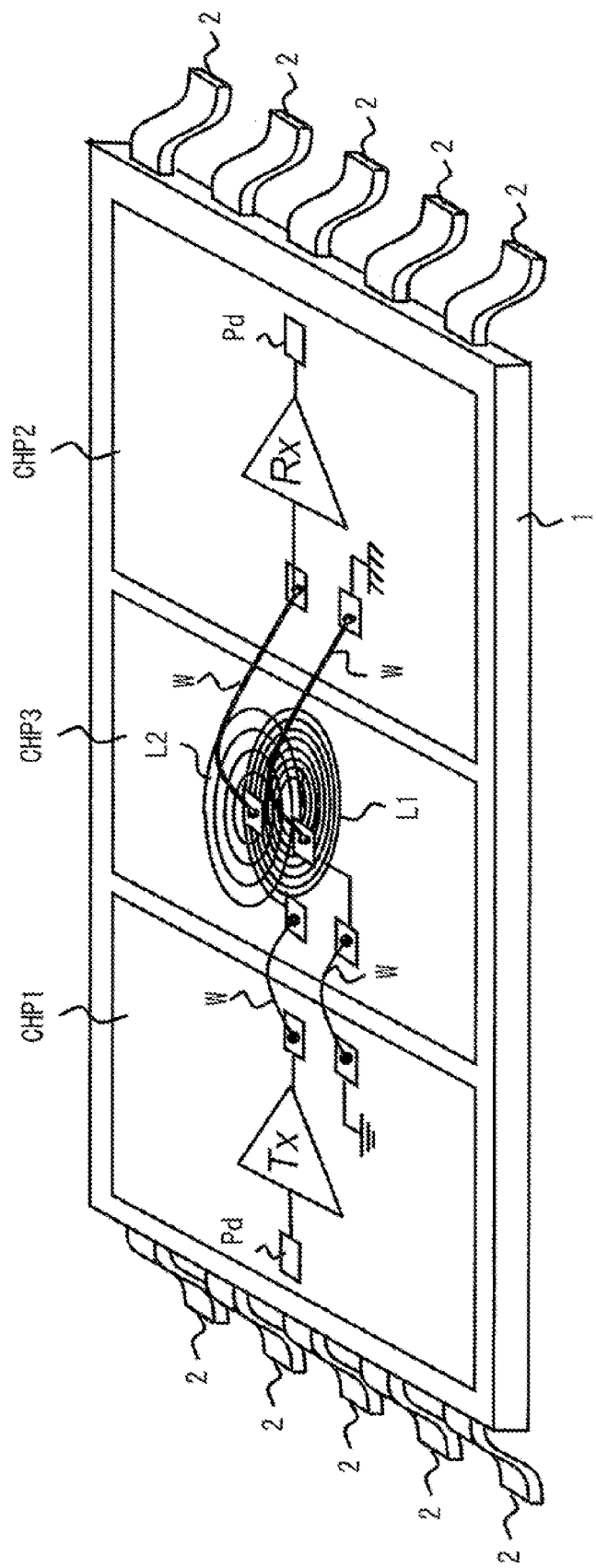
FIG. 13 is a schematic view showing a mounted state of the semiconductor device according to the first exemplary embodiment.

Subsequently, in the mounted state shown in FIG. 13, the transmission circuit Tx is formed on the first semiconductor substrate CHP1; the reception circuit Rx is formed on the second semiconductor substrate CHP2; and the primary coil L1 and the secondary coil L2 are formed on a third semiconductor substrate CHP3. A pad connected to the primary coil L1 is formed on the first semiconductor substrate CHP1, and a pad connected to the secondary coil L2 is formed on the second semiconductor substrate CHP2. Further, a pad connected to the primary coil L1 and a pad connected to the secondary coil L2 are formed on the third semiconductor substrate CHP3. The transmission circuit Tx is connected to one end of the primary coil L1, which is formed on the third semiconductor substrate CHP3, through the pad and the bonding wire W. The reception circuit Rx is connected to one end of the secondary coil L2, which is formed on the third semiconductor substrate CHP3, through the pad and the bonding wire W. The other end of the primary coil L1 is connected to the ground line on the side of the transmission circuit Tx through the pad and the bonding wire W which are formed on the first semiconductor substrate CHP1. The other end of the secondary coil L2 is connected to the ground line on the side of the reception circuit Rx through the pad and the bonding wire W which are formed on the second semiconductor substrate CHP2. In the example shown in FIG. 13, the primary coil L1 and the secondary coil L2 are formed using the first wiring layer and the second wiring layer which are vertically stacked within one semiconductor chip.

Figure 14:
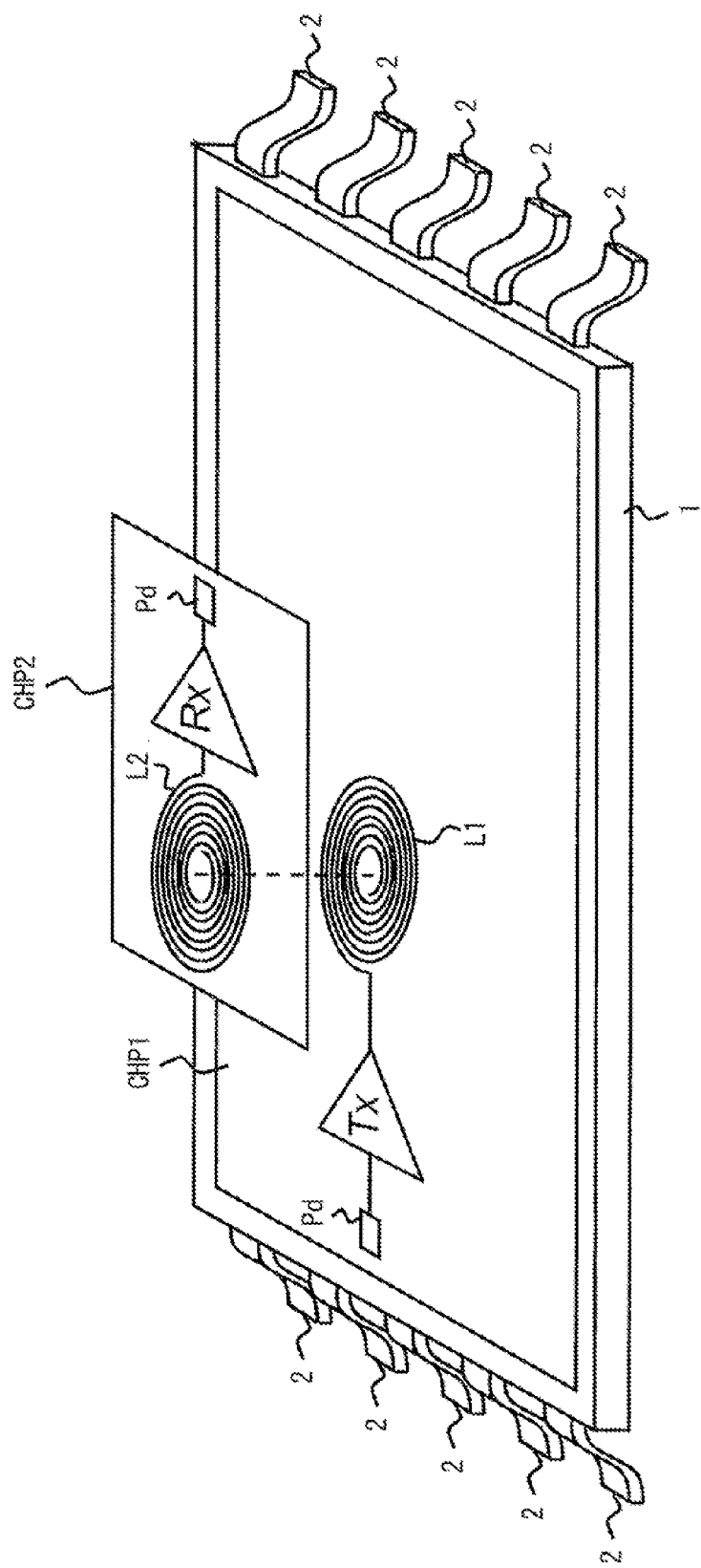
FIG. 14 is a schematic view showing a mounted state of the semiconductor device according to the first exemplary embodiment.
Figure 15:
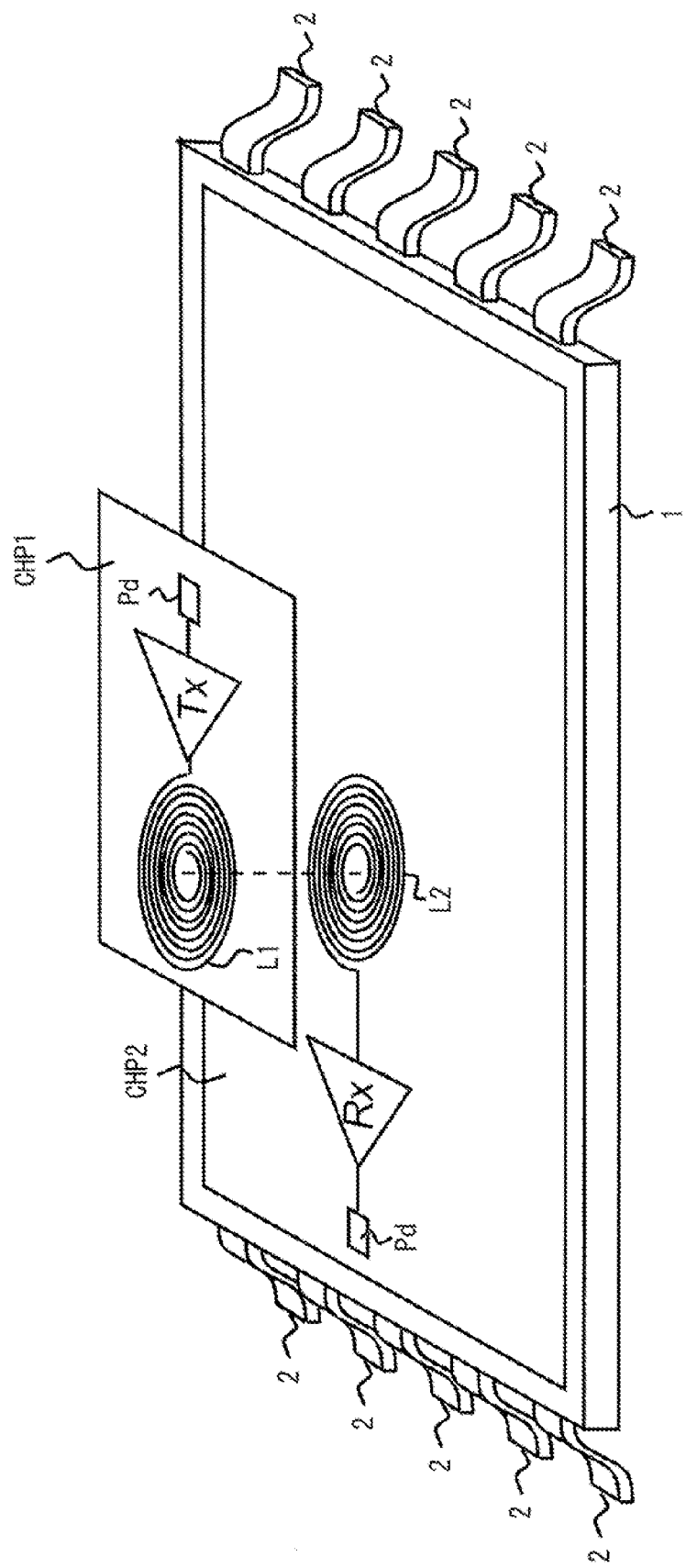
FIG. 15 is a schematic view showing a mounted state of the semiconductor device according to the first exemplary embodiment.

In the examples shown in FIGS. 14 and 15, the transmission circuit Tx and the primary coil L1 are formed on the first semiconductor substrate CHP1, and the reception circuit Rx and the secondary coil L2 are formed on the second semiconductor substrate CHP2. In the examples shown in FIGS. 14 and 15, the first semiconductor substrate CHP1 and the second semiconductor substrate CHP2 are stacked. In the examples shown in FIGS. 14 and 15, the first semiconductor substrate CHP1 and the second semiconductor substrate CHP2 are arranged so that the center positions of the primary coil L1 and the secondary coil L2 are aligned in the stacked state.

Figure 16:
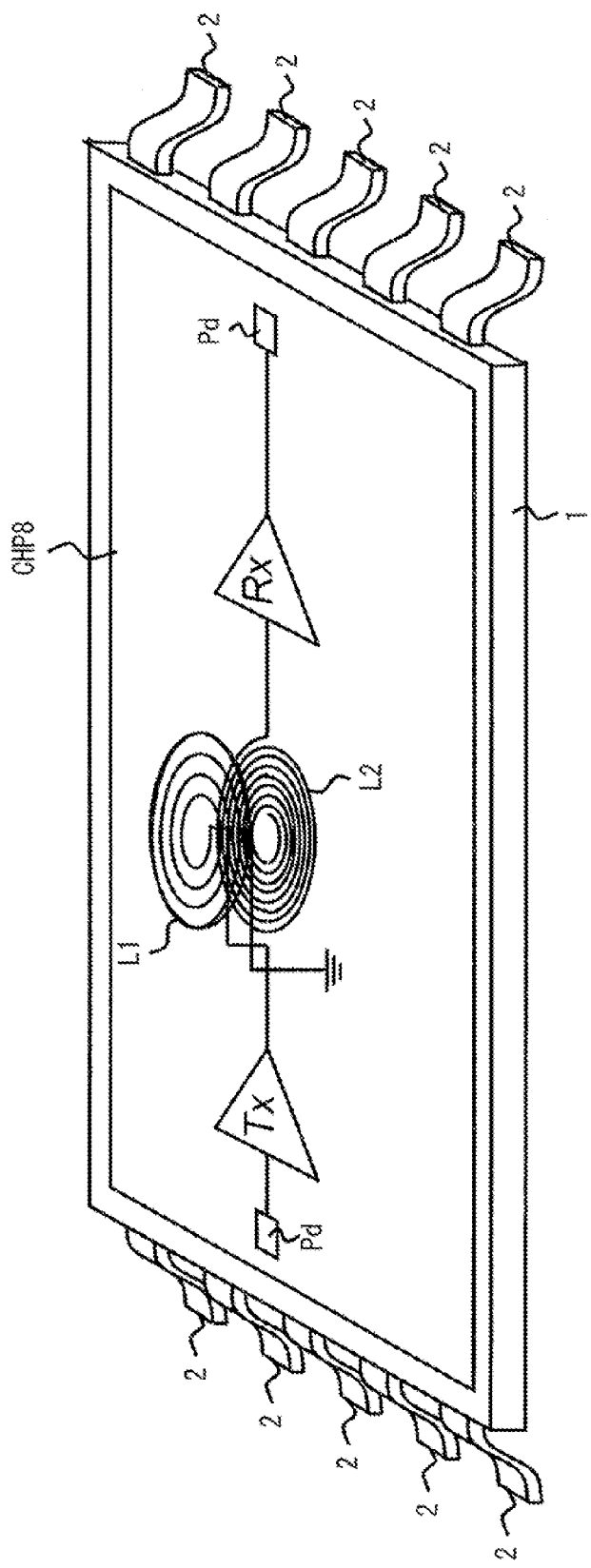
FIG. 16 is a schematic view showing a mounted state of the semiconductor device according to the first exemplary embodiment.
Figure 17:
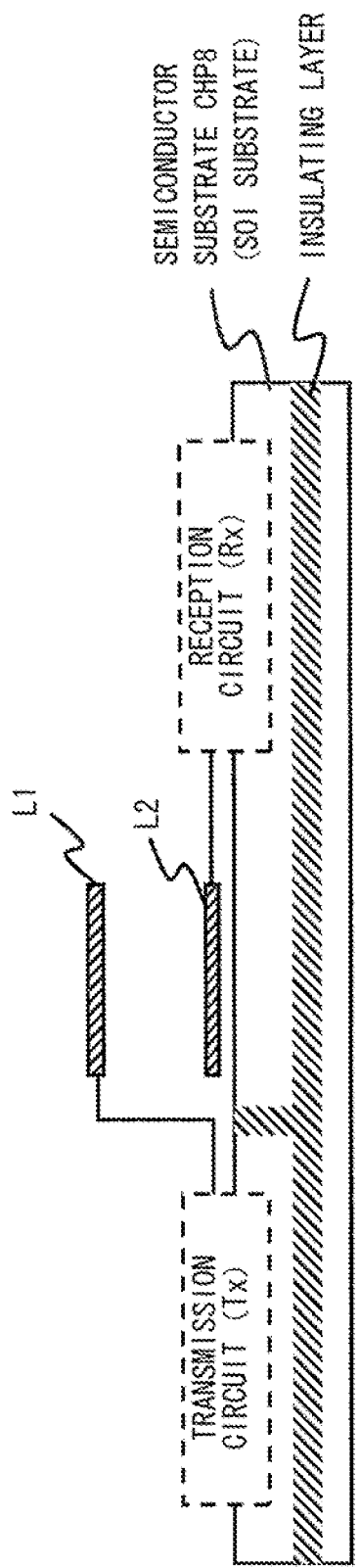
FIG. 17 is a schematic sectional view of a semiconductor substrate of the semiconductor device shown in FIG. 16.
Figure 18:
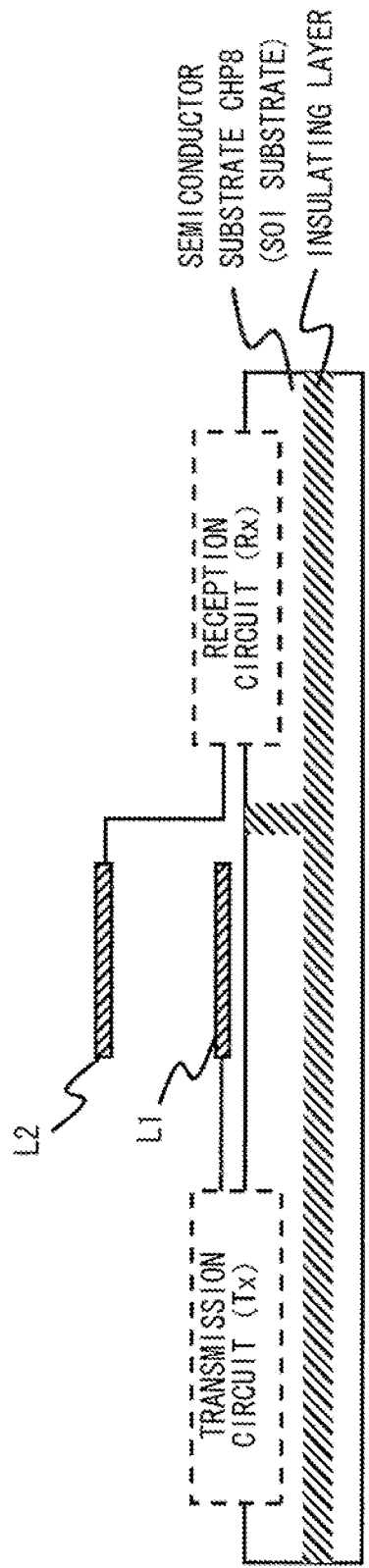
FIG. 18 is a schematic sectional view of the semiconductor substrate of the semiconductor device shown in FIG. 16.

In the example shown in FIG. 16, the transmission circuit Tx, the reception circuit Rx, the primary coil L1, and the secondary coil L2 are formed on a semiconductor substrate CHP8. In the example shown in FIG. 16, the primary coil L1 and the secondary coil L2 are formed using the first wiring layer and the second wiring layer which are vertically stacked. A region where the transmission circuit Tx is disposed and a region where the reception circuit Rx is disposed are electrically insulated from each other by an insulating layer formed on the semiconductor substrate CHP8. FIGS. 17 and 18 each show a sectional view of the semiconductor substrate CHP8. In the example shown in FIG. 17, the region where the transmission circuit Tx is formed and the region where the reception circuit Rx is formed are electrically separated by the insulating layer. The primary coil L1 and the secondary coil L2 are formed in the region where the transmission circuit Tx is formed. Meanwhile, in the example shown in FIG. 18, the region where the transmission circuit Tx is formed and the region where the reception circuit Rx is formed are electrically separated by the insulating layer. The primary coil L1 and the secondary coil L2 are formed on the region where the reception circuit Rx is formed.

Figure 19:
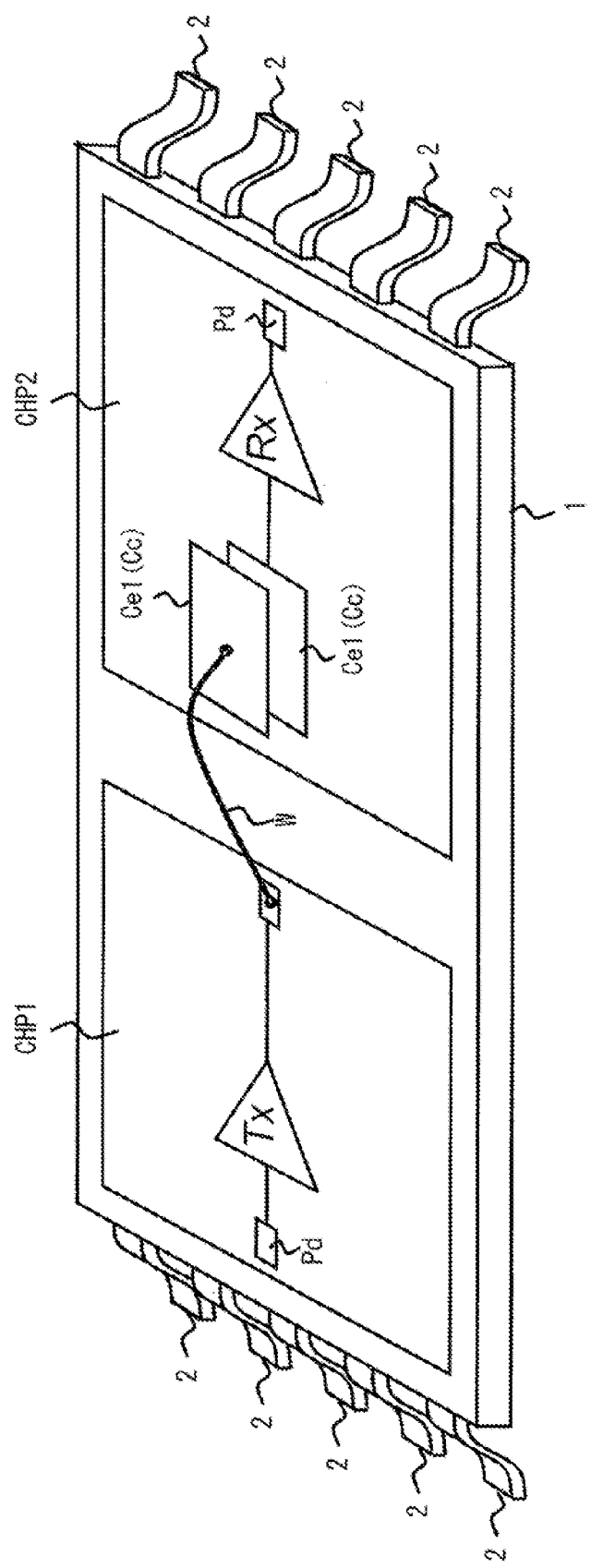
FIG. 19 is a schematic view showing a mounted state of the semiconductor device according to the first exemplary embodiment.

In the mounting example shown in FIG. 19, the transformers in the mounting example of the semiconductor device shown in FIG. 1 are replaced with capacitors. That is, the semiconductor device shown in FIG. 19 is a mounting example in which capacitors are used as AC coupling elements.

The capacitors for signal transmission in the semiconductor device shown in FIG. 19 have a configuration in which metal lines (electrodes Ce1 and Ce2 shown in FIG. 19) formed in different wiring layers are used as two electrodes and a dielectric (for example, an interlayer insulating film) filled between the metal lines is used as a dielectric.

Figure 20:
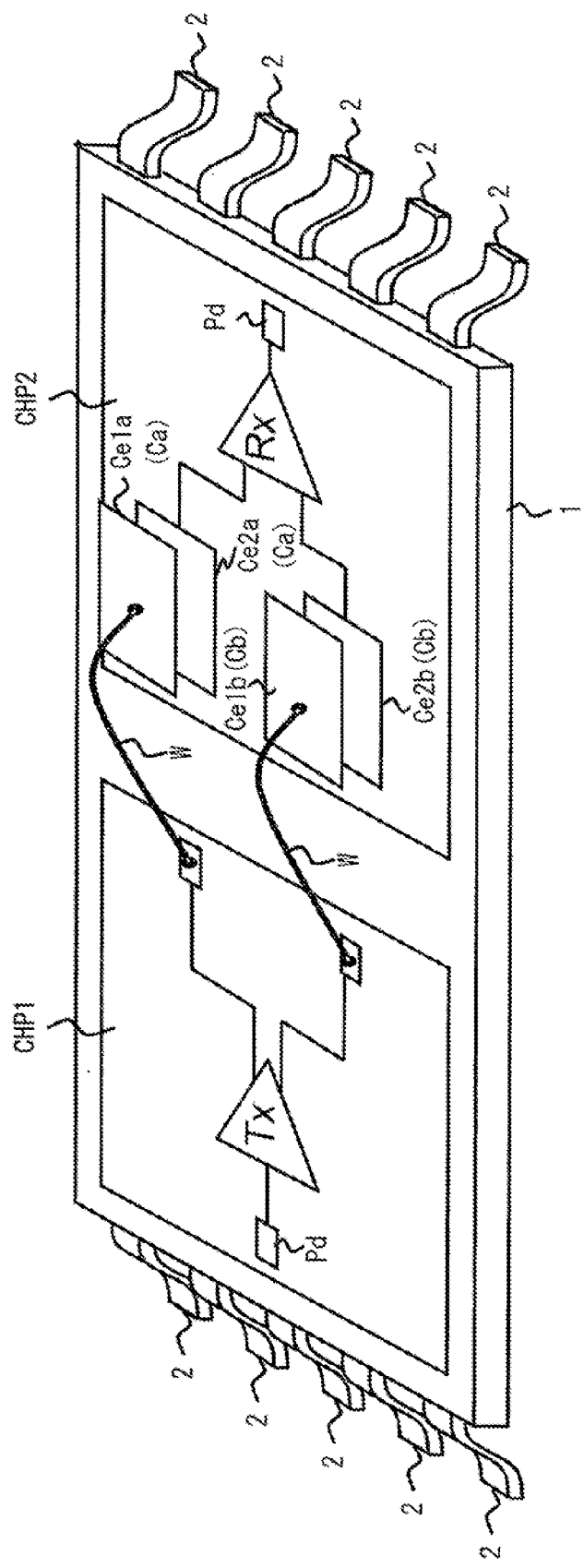
FIG. 20 is a schematic view showing a mounted state of the semiconductor device according to the first exemplary embodiment.

In the mounting example shown in FIG. 20, the transformers in the mounting example shown in FIG. 8 are replaced with capacitors. The mounting example shown in FIG. 20 includes first capacitors Ca in which the first primary coil L11 and the first secondary coil L12, which constitute the first transformer, are respectively replaced with an electrode Ce1*a* and an electrode Ce2*a*; and second capacitors Cb in which the second primary coil L11 and the second secondary coil L12, which constitute the second transformer, are respectively replaced with an electrode Ce1*b* and an electrode Ce2*b*. As in the mounting example shown in FIG. 19, each of the first capacitor Ca and the second capacitor Cb has a configuration in which an interlayer insulating film formed between the electrodes is used as a dielectric.

Figure 21:
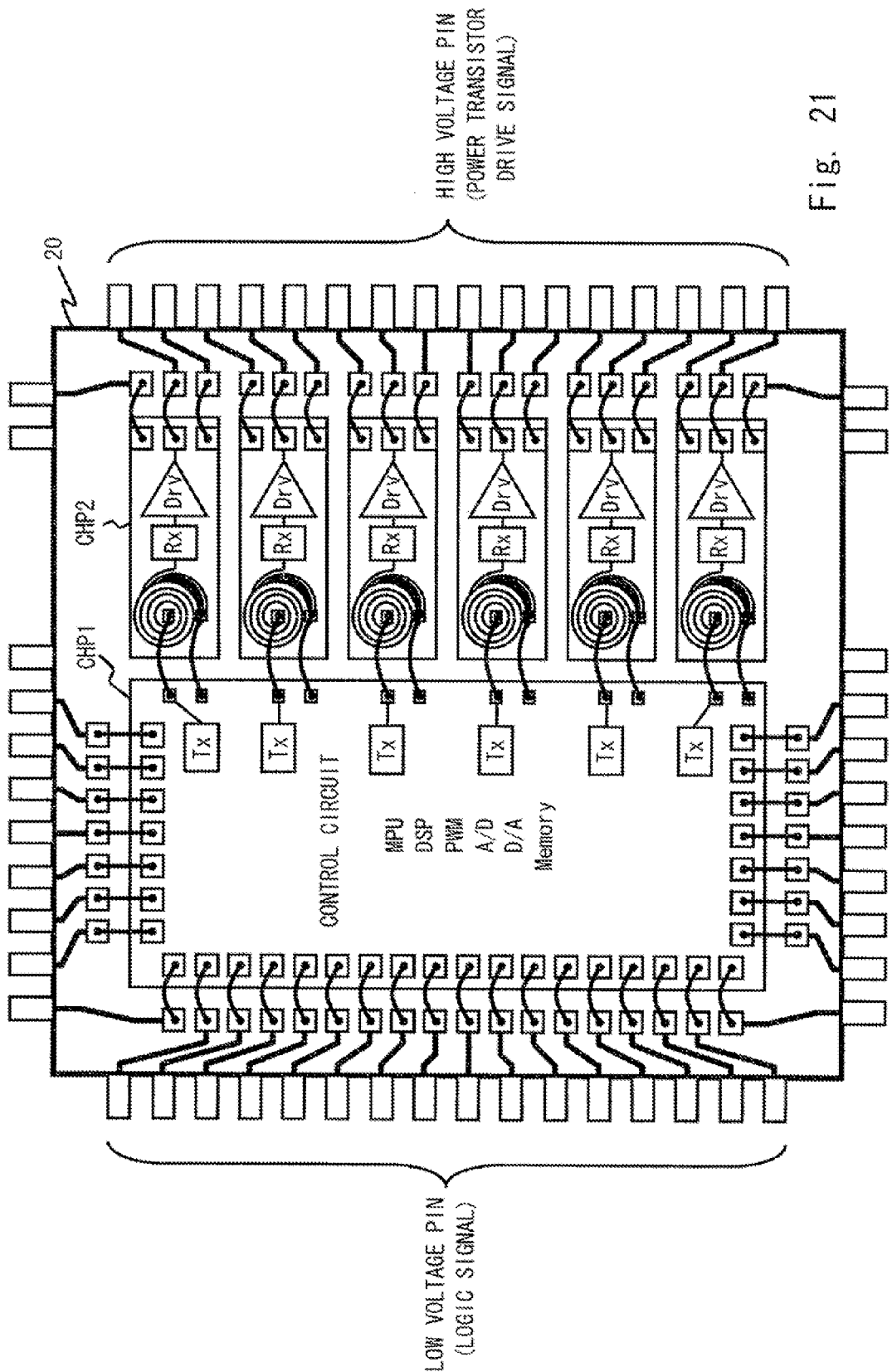
FIG. 21 is a schematic view of a semiconductor package to which the semiconductor device according to the first exemplary embodiment is applied.

Subsequently, a semiconductor package to which the semiconductor device according to the first exemplary embodiment is applied will be described. FIG. 21 shows a schematic view of a semiconductor package 20 including the first semiconductor substrate CHP1 and the second semiconductor substrate CHP2 according to the first exemplary embodiment.

In the application shown in FIG. 21, one first semiconductor substrate CHP1 and six semiconductor substrates CHP2 are mounted in a single semiconductor package 20. Accordingly, a number of transmission circuits Tx corresponding to the number of the second semiconductor substrates CHP2 are provided on the first semiconductor substrate CHP1. Assume that the transmission circuits Tx individually receive control signals which are transmitted from the control circuit CONT formed on the first semiconductor substrate CHP1 to the second semiconductor substrate CHP2. In the semiconductor device according to this exemplary embodiment, the AC coupling elements are formed on one of the first semiconductor substrate CHP1 and the second semiconductor substrate. This allows a plurality of second semiconductor substrates CHP2 to be mounted in a single semiconductor package 20. The semiconductor package shown in FIG. 21 can be used as a Motor drive control system, for example. In the semiconductor package 20, external connection terminals associated with the second semiconductor substrate CHP2 are defined as high voltage pins that allow a high voltage to be input and output, and other terminals are defined as low voltage pins that inhibit a high voltage from being applied.

Figure 22:
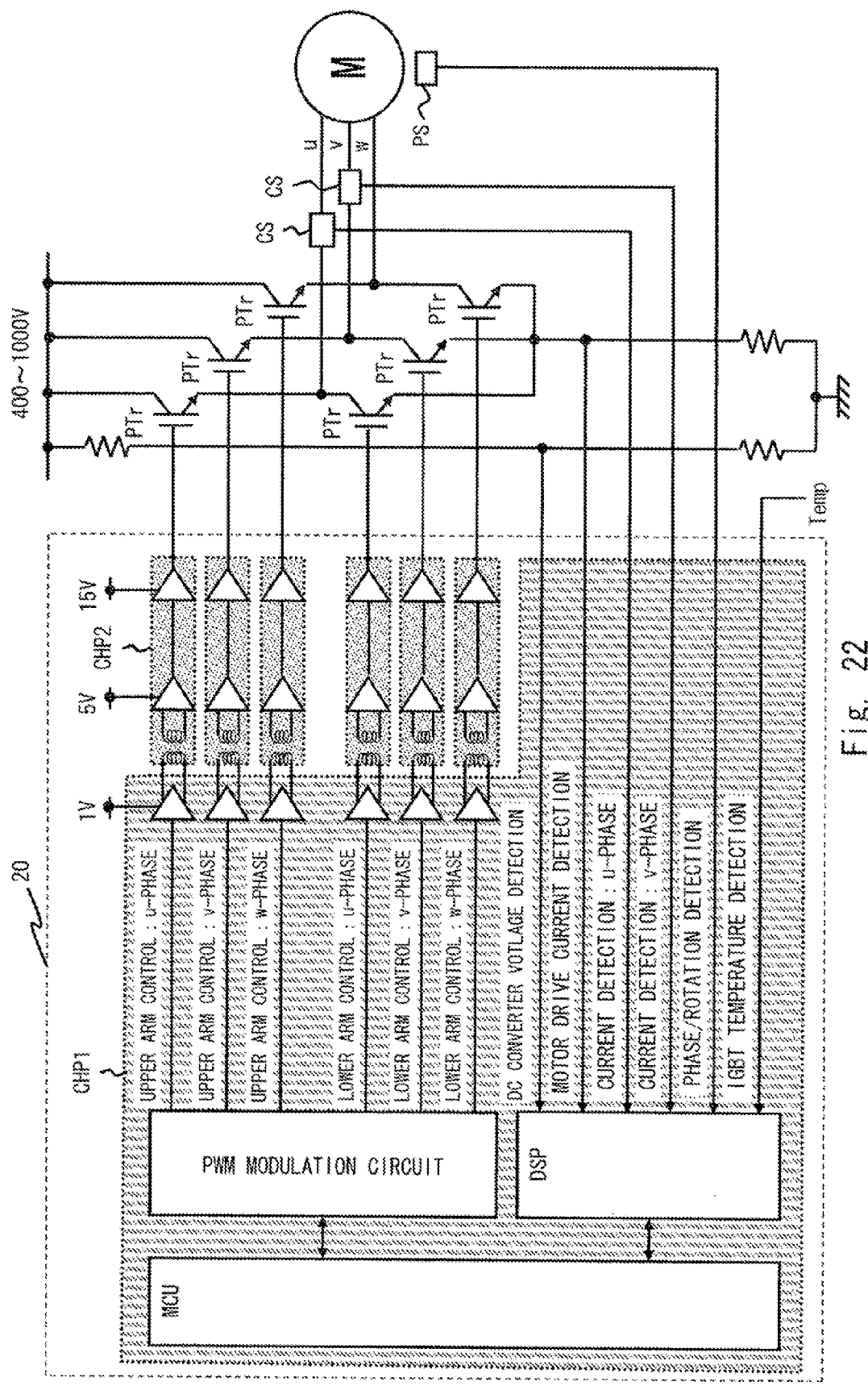
FIG. 22 is a block diagram of a motor drive control system to which the semiconductor package shown in FIG. 21 is applied.

FIG. 22 shows a block diagram of a motor drive control system (an application of the semiconductor device according to this exemplary embodiment) using the semiconductor package 20. As shown in FIG. 22, in the motor drive control system using the semiconductor package 20, a three-phase drive motor M is used as a control target circuit. The motor M is driven by drive signals having three different phases of u-phase, v-phase, and w-phase. In the first semiconductor substrate CHP1, the control circuit (including a MCU, a PWM circuit, and a DSP) generates an upper arm control signal for u-phase, an upper arm control signal for v-phase, an upper arm control signal for w-phase, a lower arm control signal for u-phase, a lower arm control signal for v-phase, and a lower arm control signal for w-phase.

The upper arm control signal for u-phase is transmitted to the power transistor PTr located on the power supply terminal side among the power transistors PTr, which generate the u-phase drive signal, through the second semiconductor substrate CHP2. The upper arm control signal for v-phase is transmitted to the power transistor PTr located on the power supply terminal side among the power transistors PTr, which generate the v-phase drive signal, through the second semiconductor substrate CHP2. The upper arm control signal for w-phase is transmitted to the power transistor PTr located on the power supply terminal side among the power transistors PTr, which generate the w-phase drive signal, through the second semiconductor substrate CHP2. The lower arm control signal for u-phase is transmitted to the power transistor PTr located on the ground terminal side among the power transistors PTr, which generate the u-phase drive signal, through the second semiconductor substrate CHP2. The lower arm control signal for v-phase is transmitted to the power transistor PTr located on the ground terminal side among the power transistors PTr, which generate the v-phase drive signal, through the second semiconductor substrate CHP2. The lower arm control signal for w-phase is transmitted to the power transistor PTr located on the ground terminal side among the power transistors PTr, which generate the w-phase drive signal, through the second semiconductor substrate CHP2.

Thus, the use of a single semiconductor package 20 enables application of the control signals to the six power transistors PTr for driving the motor M. The control circuit provided on the first semiconductor substrate CHP1 can receive various signals for detecting the operating status of the motor M and can control the motor M based on the received detection signals. In the example shown in FIG. 22, the control circuit receives a DC converter voltage (power supply voltage) detection signal, a motor drive current detection signal, a u-phase current detection signal, v-phase current detection signal, a phase/rotation detection signal, and an IGBT temperature detection signal. Assume that the voltage level of each of these detection signals is set to such a level as to be received by the first semiconductor substrate CHP1 without involving the second semiconductor substrate CHP2. The current detection signal is supplied from a current detection circuit CS, and the phase/rotation detection signal is output by a phase rotation detection circuit PS.

Figure 23:
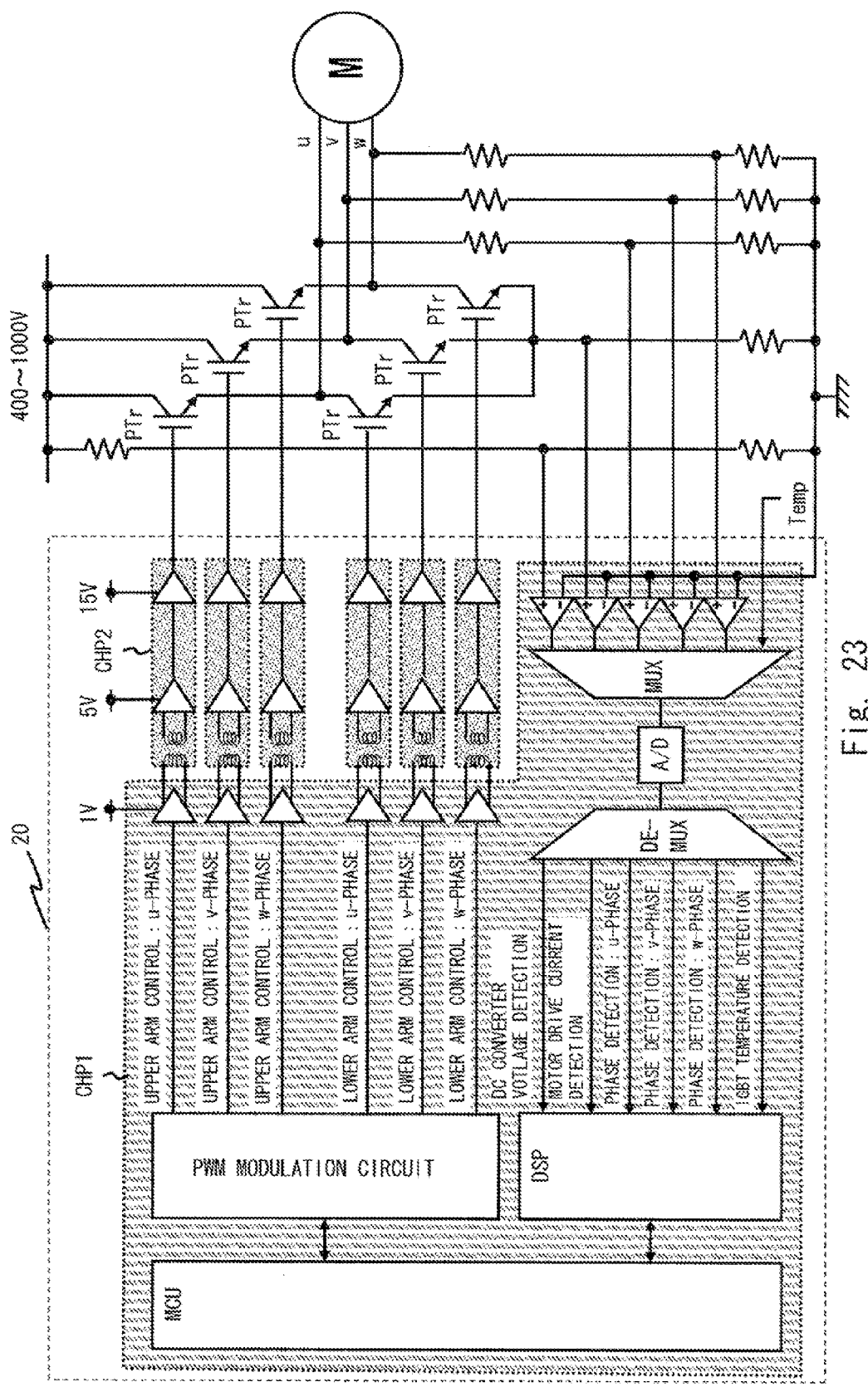
FIG. 23 is a block diagram of a motor drive control system to which the semiconductor package shown in FIG. 21 is applied.

FIG. 23 shows a modified example of the application shown in FIG. 22. In the example shown in FIG. 23, the first semiconductor substrate CHP1 includes a multiplexer MUX (or a multiplexing circuit), a demultiplexer DE-MUX, and an analog-to-digital conversion circuit (indicated by A/D in the figure). Thus, feedback signals, such as a phase detection signal, a rotation detection signal, a current detection signal, a voltage detection signal, and a temperature detection signal, which are fed back from the motor M, may be fed back to the control circuit through the multiplexing circuit, the multiplexer MUX, or the demultiplexer DE-MUX.

Figure 24:
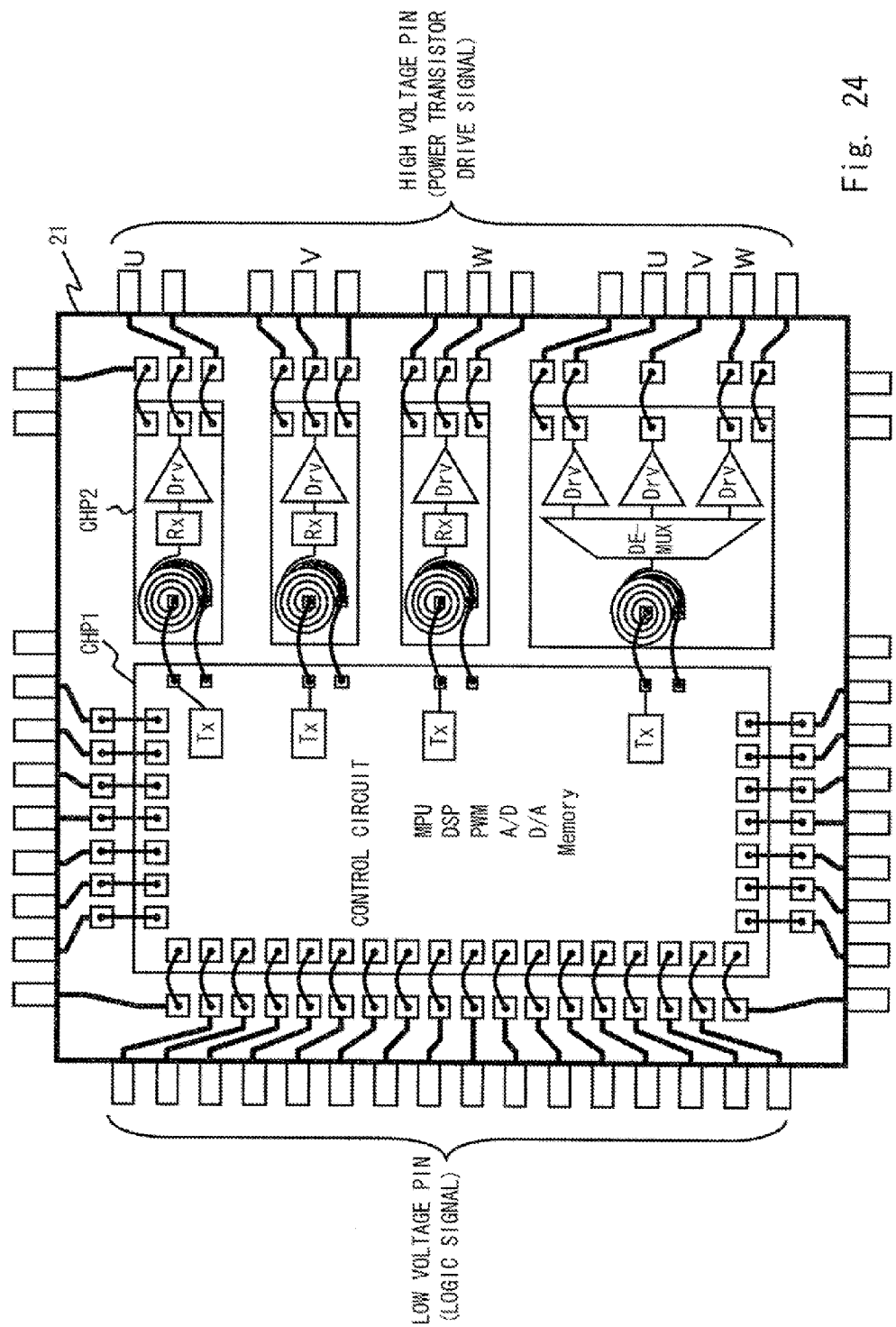
FIG. 24 is a schematic view of a semiconductor package to which the semiconductor device according to the first exemplary embodiment is applied.

FIG. 24 shows a schematic view of a semiconductor package 21 which is a modified example of the semiconductor package shown in FIG. 21. As shown in FIG. 24, in the semiconductor package 21, three gate drive circuits Drv, which transmit the lower arm control signals, are mounted on a single second semiconductor substrate CHP2. In the first semiconductor substrate CHP1, one transmission circuit Tx, which transmits the lower arm control signals, is provided to correspond to the number of the second semiconductor substrates CHP2. Each lower arm control signal has a lower signal level than each upper arm control signal. Accordingly, a transistor having the same breakdown voltage as the reception circuit Rx may be used for the semiconductor substrate CHP2 corresponding to the lower arm control signals, for example. This permits more circuit elements to be formed in a small circuit area on the second semiconductor substrate CHP2. As a result, a mounting mode as shown in FIG. 24 can be implemented. The employment of this mounting mode can suppress the size of the semiconductor package.

Figure 25:
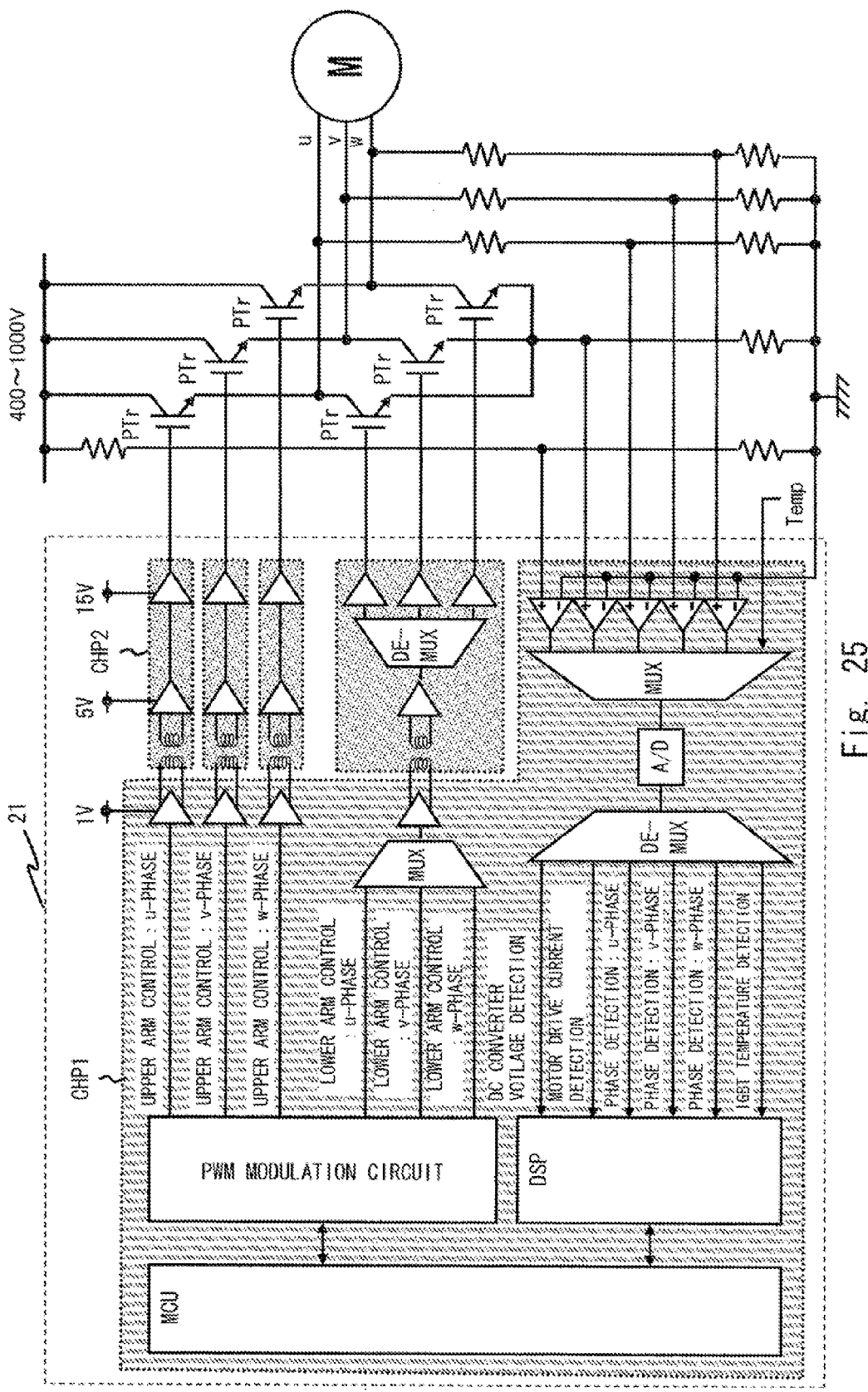
FIG. 25 is a block diagram of a motor drive control system to which the semiconductor package shown in FIG. 24 is applied to the motor drive control system.

FIG. 25 shows a block diagram of a motor drive control system using the semiconductor package 21 shown in FIG. 24. As shown in the block diagram of FIG. 25, the semiconductor package 21 is employed in the motor drive control system shown in FIG. 23. Thus, as shown in the block diagram of FIG. 25, the number of the second semiconductor substrates CHP2 corresponding to the lower arm control signals is one.

Figure 26:
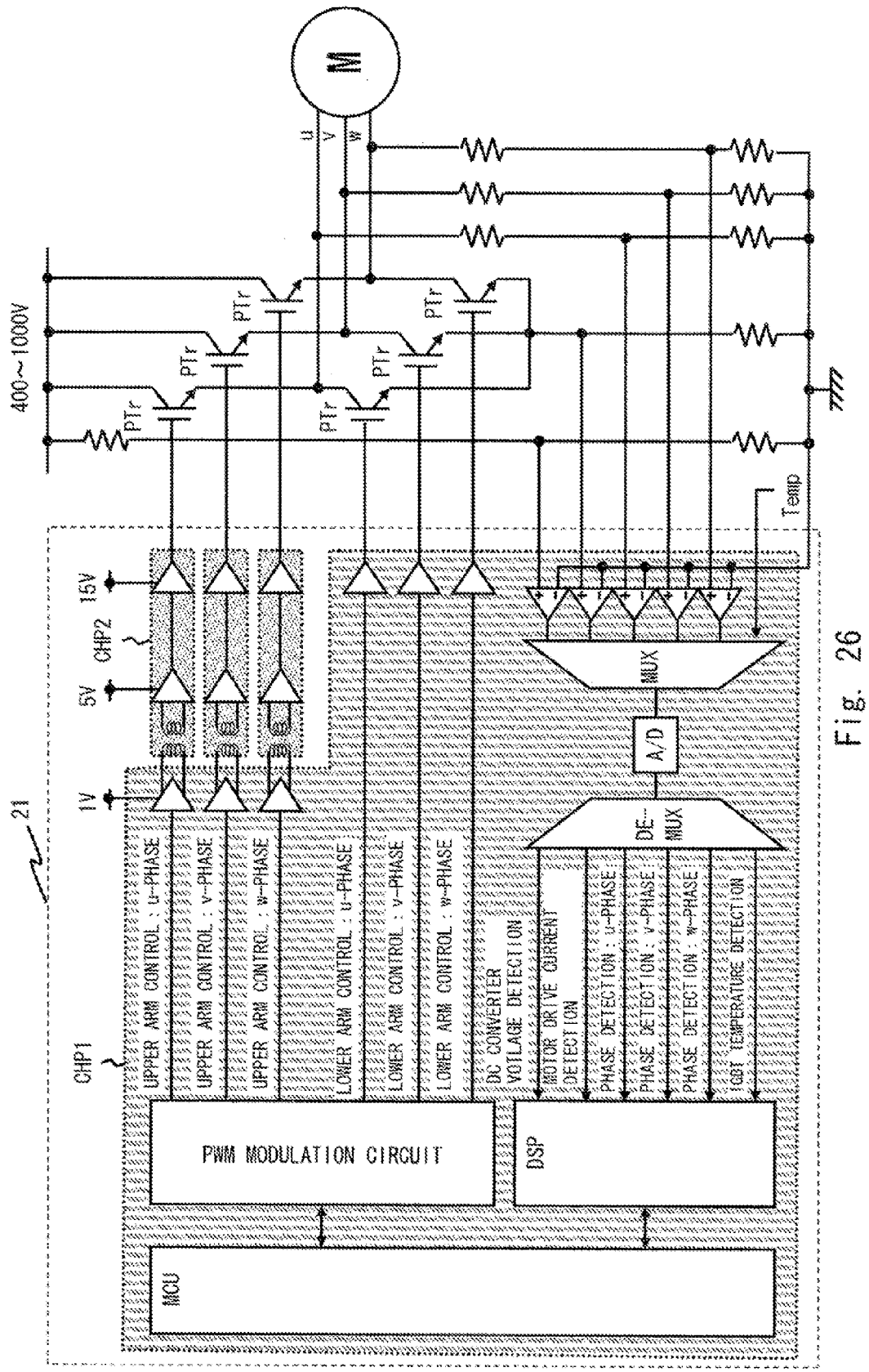
FIG. 26 is a block diagram of a motor drive control system to which the semiconductor package shown in FIG. 24 is applied.

Each lower arm control signal has a lower signal level than each upper arm control signal. Accordingly, when a circuit element having a breakdown voltage high enough to withstand this signal level can be formed on the first semiconductor substrate CHP1, a circuit configuration as shown in FIG. 26 can also be employed. FIG. 26 is a modified example of the motor drive control system shown in FIG. 23, in which the first semiconductor substrate CHP1 includes a circuit element having a breakdown voltage high enough to withstand to the signal level of the lower arm control signals. As shown in FIG. 26, in this case, the motor M can be controlled without using the second semiconductor substrate CHP2 for transmitting the lower arm control signals. In the application shown in FIG. 26, the circuit size can be made smaller than that of other applications.

Figure 27:
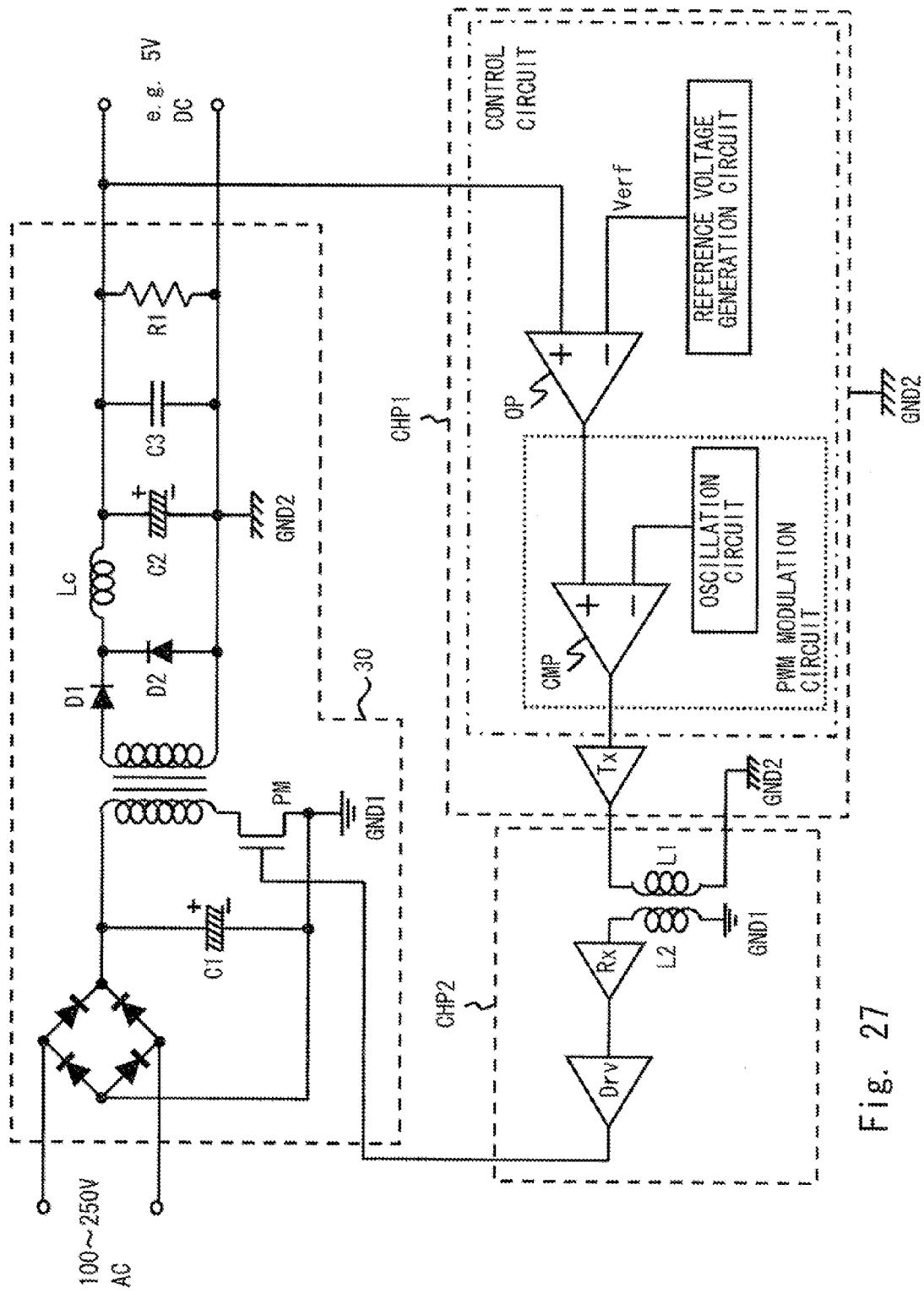
FIG. 27 is a block diagram of a power supply control circuit to which the semiconductor device according to the first exemplary embodiment is applied.
Figure 33:
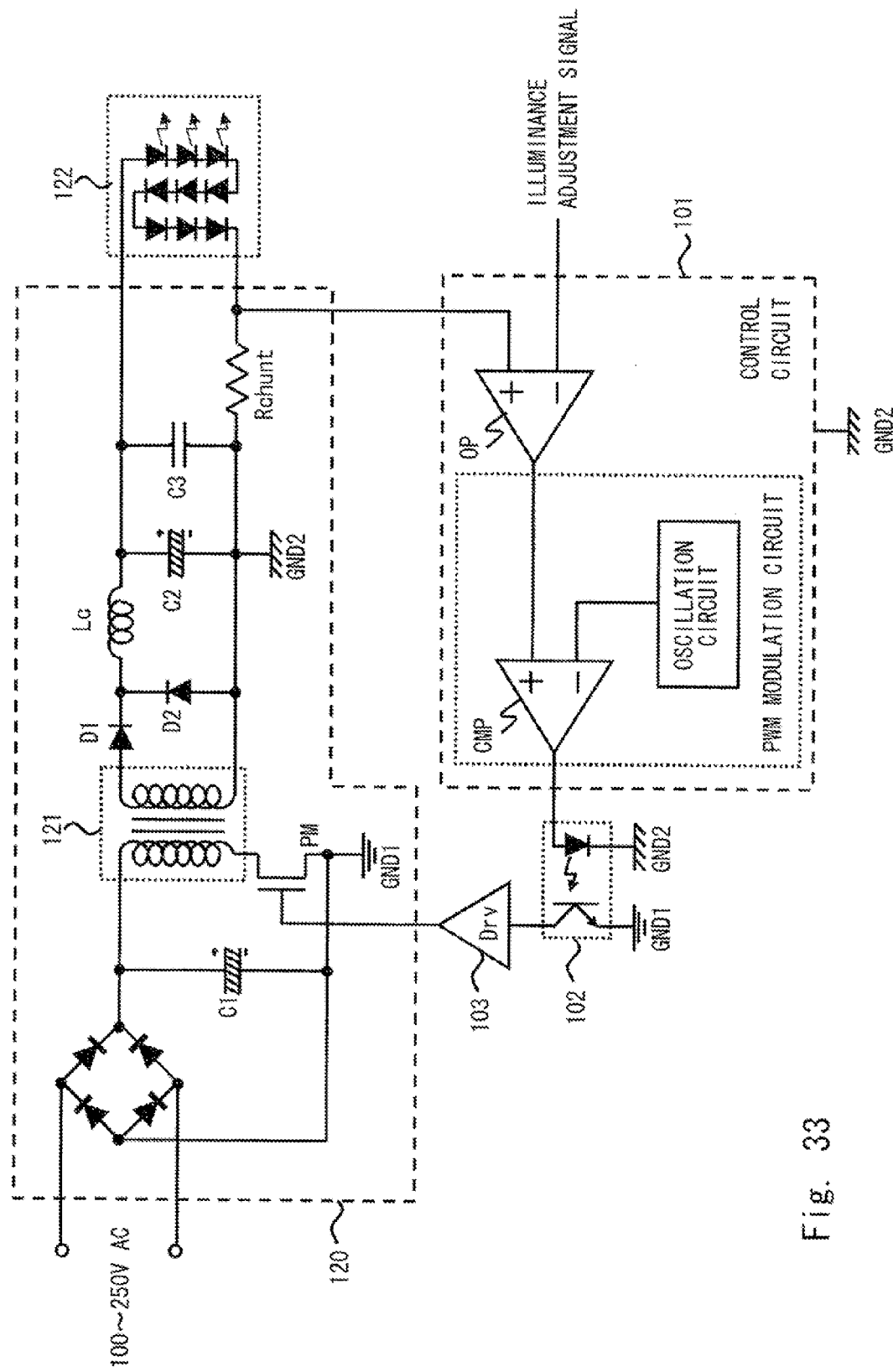
FIG. 33 is a block diagram of a lighting system using an insulating interface of the related art.

The semiconductor device according to the first exemplary embodiment can also be applied to a power supply circuit control system. FIG. 27 shows a block diagram of the power supply circuit control system to which the semiconductor device according to the first exemplary embodiment is applied. In the example shown in FIG. 27, the first semiconductor substrate CHP1 and the second semiconductor substrate CHP2 are formed on a power supply circuit 30. The operation of the power supply circuit 30 is substantially the same as the operation of the power supply circuit 120 described with reference to FIG. 33, so the description thereof is omitted.

An operational amplifier OP and a PWM circuit are provided as control circuits for the first semiconductor substrate CHP1. The operational amplifier OP compares an output of the power supply circuit 30 with a reference voltage Vref output by a reference voltage generation circuit, amplifies a difference voltage component, and outputs the amplified component to the PWM circuit. The PWM circuit compares the voltage of the output signal from the operational amplifier OP with the signal level of a chipping wave signal or a saw-tooth wave signal output by the oscillation circuit, and outputs the comparison result to the transmission circuit Tx.

The transmission circuit Tx of the first semiconductor substrate CHP1 generates a pulse signal based on a PWM signal output by the PWM circuit, and drives the primary coil L1. In the second semiconductor substrate CHP2, the reception circuit Rx receives the pulse signal through the secondary coil L2, and demodulates the received pulse signal, thereby reproducing a PWM control signal. The gate drive circuit Drv formed on the second semiconductor substrate CHP2 drives a power MOS transistor PM using the PWM control signal reproduced by the reception circuit Rx.

Also in the example shown in FIG. 27, as with other applications, the first semiconductor substrate CHP1 and the second semiconductor substrate CHP2 are mounted in a single semiconductor package. Also in the example shown in FIG. 27, the power MOS transistor PM can be controlled and driven by two semiconductor substrates.

As described above, the semiconductor device according to the first exemplary embodiment includes the first semiconductor substrate CHP1 including the control circuit CONT that generates a control signal for a control target circuit (for example, the motor M or the power supply circuit 30) and the transmission circuit Tx that generates a transmission signal by modulating the control signal; the second semiconductor substrate CHP2 including the reception circuit Rx that demodulates the transmission signal transmitted from the transmission circuit Tx to reproduce the control signal, and the drive circuit Drv that drives the control target circuit based on the control signal output from the reception circuit Rx, the second semiconductor substrate CHP2 being electrically insulated from the first semiconductor substrate CHP1; the AC coupling element that is formed on a semiconductor substrate and couples the first semiconductor substrate CHP1 and the second semiconductor substrate CHP2 in an alternating manner; and the semiconductor package including the first semiconductor substrate CHP1, the second semiconductor substrate CHP2, and the AC coupling element mounted therein.

With this configuration, the semiconductor device according to the first exemplary embodiment can control the semiconductor device, which requires signal transmission through an insulating interface, by use of a single semiconductor package. In other words, in the semiconductor device according to the first exemplary embodiment, the circuit area and mounting area can be further reduced as compared with the semiconductor device of the related art. The second semiconductor substrate according to the first exemplary embodiment includes the reception circuit Rx and the gate drive circuit Drv, thereby improving the reliability of signal transmission.

In the first exemplary embodiment, the AC coupling element for use as an insulating interface can be formed on a semiconductor substrate. Accordingly, a plurality of insulating interfaces can be mounted in a single semiconductor package. That is, a plurality of insulating interface channels can be mounted in a single semiconductor package, which has been conventionally difficult to achieve.

In the first semiconductor substrate CHP1, the control circuit CONT and the transmission circuit Tx are composed of circuit elements that are formed by a finer process than that of the second semiconductor substrate CHP2. Thus, the semiconductor device according to the first exemplary embodiment achieves downsizing and high-speed operation of the first semiconductor substrate. The degree of fineness of the process is determined by a minimum gate length of transistors formed on the first semiconductor substrate CHP1 and the second semiconductor substrate CHP2. The circuit elements constituting the first semiconductor substrate CHP1 are formed by a finer process than that of the second semiconductor substrate CHP2, and thus have a lower breakdown voltage than that of the circuit elements constituting the second semiconductor substrate CHP2.

The reception circuit Rx of the second semiconductor substrate CHP2 is composed of circuit elements which have a lower breakdown voltage than that of the gate drive circuit Drv of the second semiconductor substrate, and is composed of circuit elements formed by a finer process. As a result, the second semiconductor substrate CHP2 achieves downsizing and an improved sensitivity to the reception signal.

The thickness of the insulating film formed between the wiring layers of the first semiconductor substrate CHP1 is smaller than the thickness of the insulating film formed between the wiring layers of the second semiconductor substrate CHP2. Therefore, the first semiconductor substrate CHP1 achieves higher integration than the second semiconductor substrate.

The line formed on the first semiconductor substrate CHP1 has a smaller film thickness than the line formed on the second semiconductor substrate CHP2. Additionally, the line formed on the first semiconductor substrate CHP1 has a smaller width than that of the line formed on the second semiconductor substrate CHP2. Thus, the circuits formed on the second semiconductor substrate CHP2, especially the gate drive circuit Drv, can output a larger current than the circuits formed on the first semiconductor substrate CHP1.

The first semiconductor substrate CHP1 operates based on a power supply voltage lower than that of the second semiconductor substrate CHP2. This allows the first semiconductor substrate CHP1 to operate at higher speed.

In the second semiconductor substrate CHP2, a level shift circuit is disposed between the reception circuit Rx and the gate drive circuit Drv. As a result, the reception circuit Rx can be formed of a transistor having a low breakdown voltage. Accordingly, the second semiconductor substrate CHP2 achieves a higher sensitivity of the reception circuit Rx and a reduction in circuit area.

The AC coupling element according to the first exemplary embodiment is formed using one of the wiring layer formed on the first semiconductor substrate CHP1 and the wiring layer formed on the second semiconductor substrate CHP2. As a result, a plurality of insulating interfaces can be mounted in a semiconductor package. Therefore, the number of semiconductor packages can be drastically reduced in the semiconductor device according to this exemplary embodiment.

The AC coupling element may be a transformer including a primary coil and a secondary coil electrically coupled to the primary coil. More alternatively, the AC coupling element may be a capacitor including the first electrode Ce1, which is connected to the output terminal of the transmission circuit Tx of the first semiconductor substrate CHP1, the second electrode Ce2, which is connected to the input terminal of the reception circuit Rx of the second semiconductor substrate CHP2, and the insulating film which is formed between the first and second electrodes and serves as a dielectric film.

In this exemplary embodiment, the inductance of the primary coil is smaller than the inductance of the secondary coil. This enables transmission of a signal having a sufficient amplitude to the reception circuit, and improves the reliability of communication. In the case of transmitting a signal from the second semiconductor substrate CHP2 to the first semiconductor substrate CHP1, an advantageous effect of preventing the reception circuit, which is formed on the first semiconductor substrate CHP1, from being broken can be achieved. This inductance ratio can be achieved by setting the number of turns of the primary coil to be smaller than the number of turns of the secondary coil. The inductance ratio is preferably determined such that one of the first coil L1 and the second coil L2 to be connected to a circuit operating with a higher power supply voltage as operating power has a larger number of turns than the other of the primary coil and the secondary coil.

The capacitors used as AC coupling elements have a configuration in which the first and second electrodes are formed using one of the wiring layer formed on the first semiconductor substrate and the wiring layer formed on the second semiconductor substrate. This allows the capacitors to be formed on a semiconductor substrate.

In the semiconductor device according to the first exemplary embodiment, the control circuit can receive response data, which is obtained from a control target circuit, without involving the second semiconductor substrate CHP2. As a result the number of the second semiconductor substrates CHP2 can be reduced, which results in downsizing of the semiconductor package.

Moreover, the transmission circuit Tx according to the first exemplary embodiment outputs a pulse signal, which corresponds to the transmission signal and has a higher frequency than the transmission signal, to the AC coupling element. Thus, a transformer having a small inductance value or a capacitor having a small capacitance value can also be used as the AC coupling element.

Second Exemplary Embodiment

Figure 28:
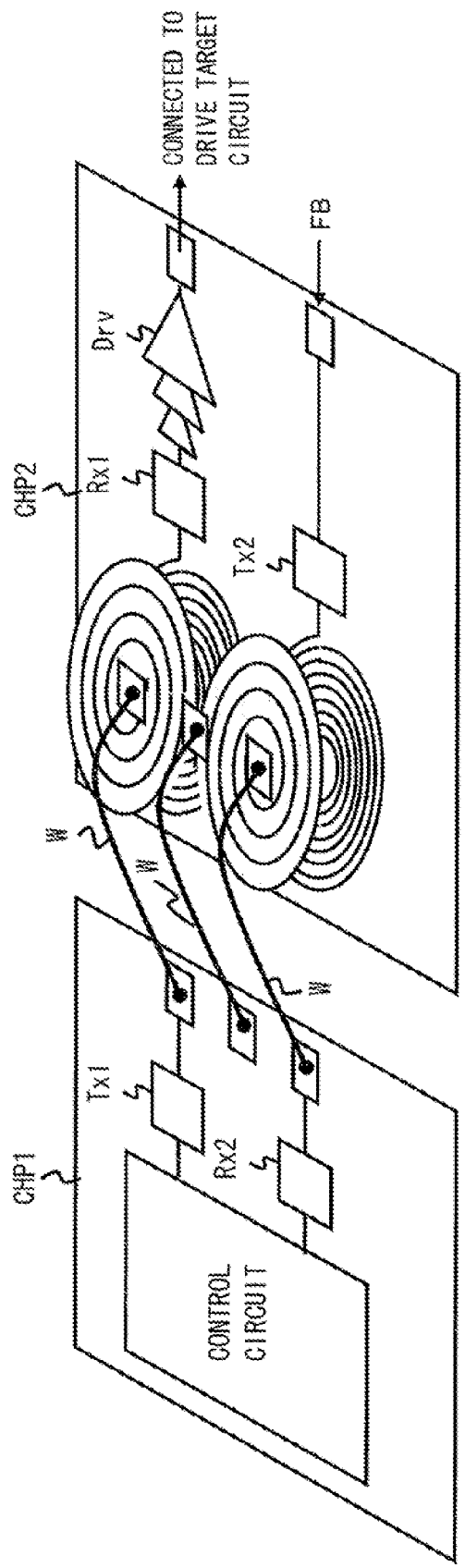
FIG. 28 is a schematic view showing a mounted state of a semiconductor device according to a second exemplary embodiment.
Figure 29:
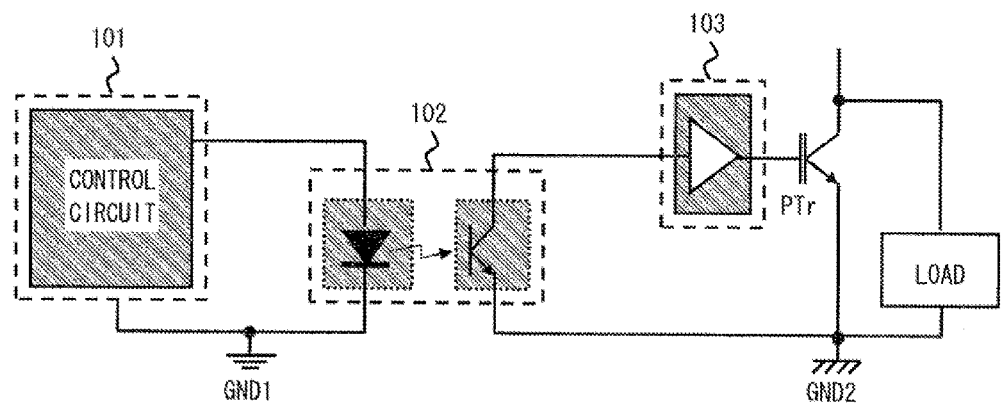
FIG. 29 is a block diagram of a typical semiconductor device using an insulating interface (photocoupler)
Figure 30:
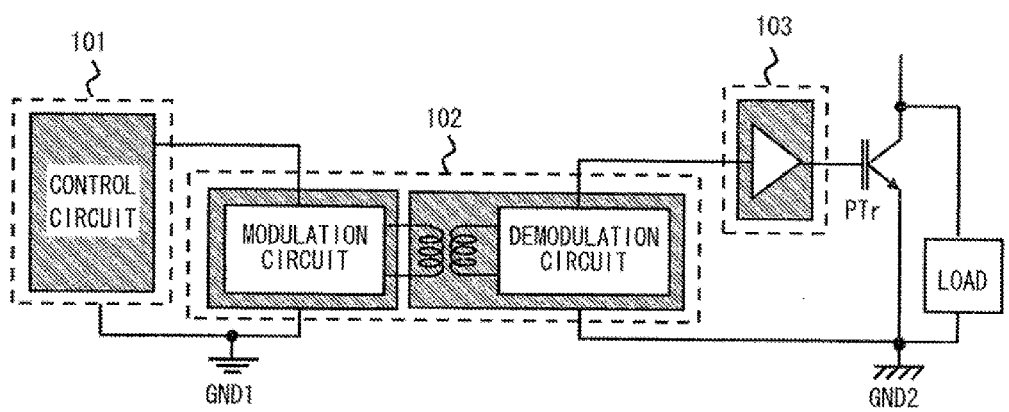
FIG. 30 is a block diagram of a typical semiconductor device using an insulating interface (transformer)
Figure 31:
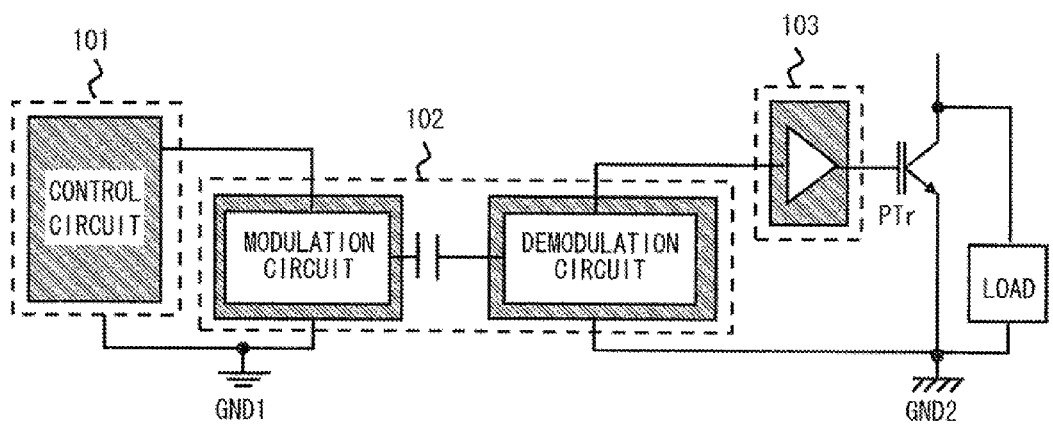
FIG. 31 is a block diagram of a typical semiconductor device using an insulating interface (capacitor)
Figure 32:
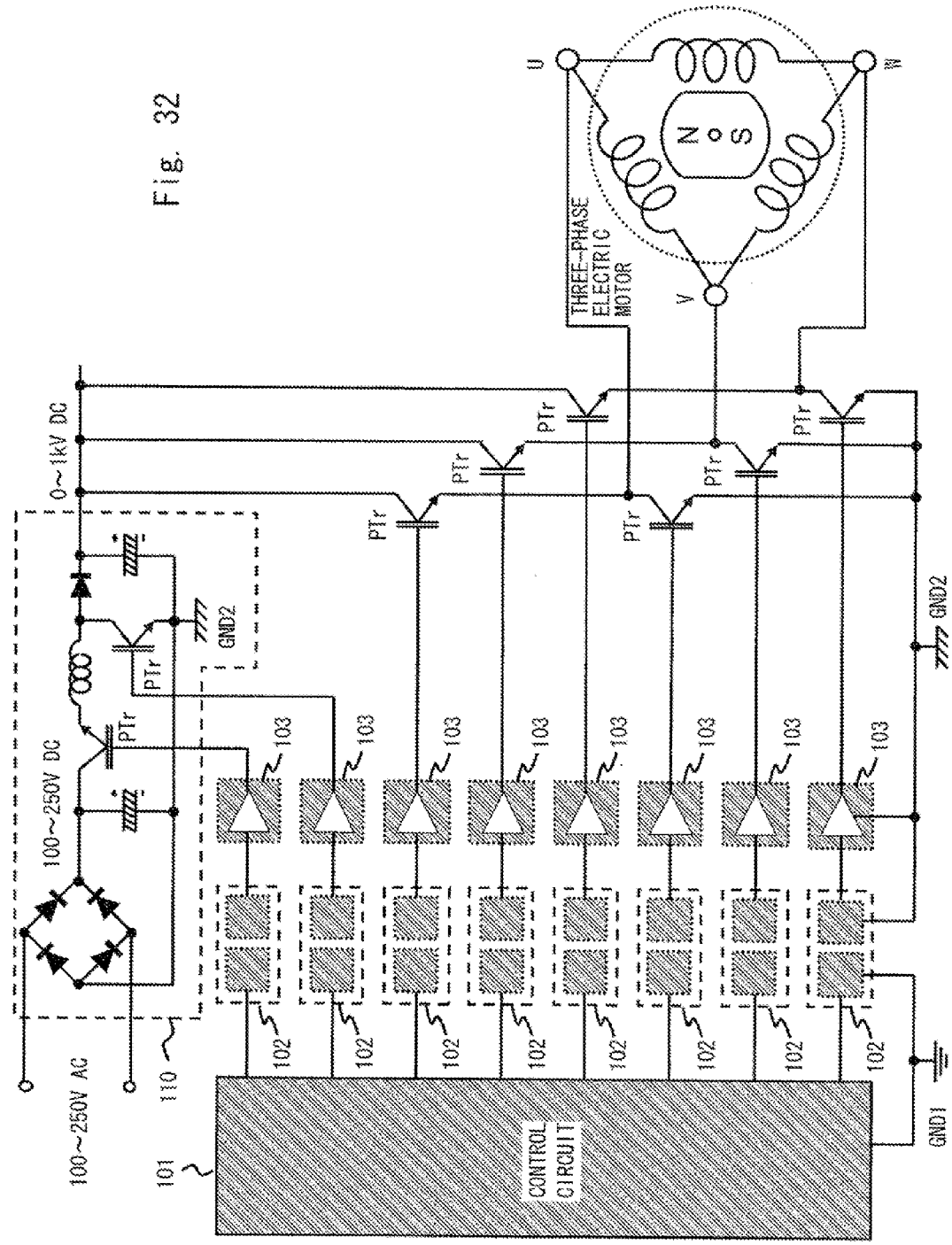
FIG. 32 is a block diagram of a motor drive control system using an insulating interface of the related art.

FIG. 28 shows a schematic view illustrating a mounted state of a semiconductor device according to a second exemplary embodiment. As shown in FIG. 28, the semiconductor device according to the second exemplary embodiment has a configuration in which a communication path from the second semiconductor substrate CHP2 to the first semiconductor substrate CHP1 is provided to the semiconductor device according to the first exemplary embodiment. Also in the semiconductor device according to the second exemplary embodiment, an AC coupling element (for example, a transformer) is used for communication. Also in the second exemplary embodiment, the transmission circuit Tx2 formed on the second semiconductor substrate CHP2 transmits a signal obtained by modulating a transmission signal, and the reception circuit Rx2 formed on the first semiconductor substrate CHP1 demodulates the signal output by the transmission circuit Tx2 to reproduce transmission data.

Thus, the provision of the communication path from the second semiconductor substrate CHP2 to the first semiconductor substrate CHP1 enables transmission of response data having a high voltage to the first semiconductor substrate CHP1.

Note that the present invention is not limited to the above exemplary embodiments, but can be appropriately modified without departing from the scope of the present invention. The present invention can be modified in configuration and details in various manners which can be understood by those skilled in the art within the scope of the present invention. A vertical MOS transistor or a bipolar transistor may also be formed on the semiconductor substrate on which the second semiconductor substrate CHP2 is formed. The vertical MOS transistor or the bipolar transistor has a high current driving ability, which is extremely effective for allowing a drive target circuit requiring a large current to operate.

This application is based upon and claims the benefit of priority from Japanese patent application No. 2009-084921, filed on Mar. 31, 2009, the disclosure of which is incorporated herein in its entirety by reference.

INDUSTRIAL APPLICABILITY

The present invention is applicable to a system in which signals are transmitted and received between a circuit that operates in a first power supply system and a circuit that operates in a second power supply system to which a power supply voltage different from that of the first power supply system is set.

REFERENCE SIGNS LIST 1, 20, 21 Semiconductor Package
2 Lead Terminal
10 Arithmetic Circuit
11 Memory
12 Oscillation Circuit
13 Pwm Circuit
20 Semiconductor Package
21 Semiconductor Package
22 Gate Drive Circuit
30 Power Supply Circuit
Ca Capacitor
Cb Capacitor
Ce1, Ce1A, Ce1B Electrode
Ce2, Ce2A, Ce2B Electrode
Chp1, Chp2 Semiconductor Substrate
Cont Control Circuit
Cs Current Detection Circuit
De-Mux Demultiplexer
Mux Multiplexer
Drv Gate Drive Circuit
Drv Drive Circuit
Go Gate Insulating Film
Inv1, Inv2 Inverter
Iw Line
Op Operational Amplifier
L1, L11, L12, L2, L21, L22 Coil
N1, N2 Nmos Transistor
P1, P2 Transistor
Pd Pad
Pm Power Mos Transistor
Ps Phase Rotation Detection Circuit
Ptr Power Transistor
Rshunt Shunt Resistor
Sd Source/Drain Region
Sft Level Shifter
Rx, Rx1, Rx2 Reception Circuit
Tx, Tx1, Tx2 Transmission Circuit
W Bonding Wire

The invention claimed is:

1. A semiconductor device comprising:
a first semiconductor substrate including: a control circuit that generates a control signal for a control target circuit; and a transmission circuit that modulates the control signal to generate a transmission signal;
a second semiconductor substrate including: a reception circuit that demodulates the transmission signal transmitted from the transmission circuit to reproduce the control signal; and a drive circuit that drives the control target circuit based on the control signal output from the reception circuit, the second semiconductor substrate being electrically insulated from the first semiconductor substrate;
an AC coupling element that is formed on a semiconductor substrate and couples the first semiconductor substrate and the second semiconductor substrate in an alternating manner; and
a semiconductor package including the first semiconductor substrate, the second semiconductor substrate, and the AC coupling element mounted therein.

2. The semiconductor device according to claim 1, wherein each of the control circuit and the transmission circuit of the first semiconductor substrate includes a circuit element formed by a finer process than that of the second semiconductor substrate.

3. The semiconductor device according to claim 2, wherein the degree of fineness of the process is determined based on a minimum gate length of a transistor formed on the first semiconductor substrate and the second semiconductor substrate.

4. The semiconductor device according to claim 1, wherein a circuit element constituting the first semiconductor substrate has a lower breakdown voltage than that of a circuit element constituting the second semiconductor substrate.

5. The semiconductor device according to claim 1, wherein the reception circuit of the second semiconductor substrate has a lower breakdown voltage than that of the drive circuit of the second semiconductor substrate, and includes a circuit element formed by a finer process.

6. The semiconductor device according to claim 1, wherein an insulating film formed between wiring layers of the first semiconductor substrate has a smaller thickness than that of an insulating film formed between wiring layers of the semiconductor substrates.

7. The semiconductor device according to claim 1, wherein a line formed on the first semiconductor substrate has a smaller film thickness than that of a line formed on the second semiconductor substrate.

8. The semiconductor device according to claim 1, wherein a line formed on the first semiconductor substrate has a smaller width than that of a line formed on the second semiconductor substrate.

9. The semiconductor device according to claim 1, wherein the first semiconductor substrate operates based on a power supply voltage lower than that of the second semiconductor substrate.

10. The semiconductor device according to claim 1, wherein a level shift circuit is disposed between the reception circuit and the drive circuit.

11. The semiconductor device according to claim 1, wherein one of a vertical MOS transistor and a bipolar transistor is formed on a semiconductor substrate on which the second semiconductor substrate is formed.

12. The semiconductor device according to claim 1, wherein the AC coupling element is formed using one of a wiring layer formed on the first semiconductor substrate and a wiring layer formed on the second semiconductor substrate.

13. The semiconductor device according to claim 1, wherein the AC coupling element includes a primary coil and a secondary coil electrically coupled to the primary coil.

14. The semiconductor device according to claim 13, wherein the primary coil has a smaller inductance than that of the secondary coil.

15. The semiconductor device according to claim 13, wherein the number of turns of the primary coil is smaller than the number of turns of the secondary coil.

16. The semiconductor device according to claim 13, wherein one of the primary coil and the secondary coil to be connected to a circuit operating with a higher power supply voltage as operating power has a larger number of turns than the other of the primary coil and the secondary coil.

17. The semiconductor device according to claim 1, wherein the AC coupling element comprises a capacitor including: a first electrode connected to an output terminal of the transmission circuit of the first semiconductor substrate; a second electrode connected to an input terminal of the reception circuit of the second semiconductor substrate; and an insulating film formed between the first and second electrodes, the insulating film serving as a dielectric film.

18. The semiconductor device according to claim 17, wherein the first and second electrodes are formed using one of a wiring layer formed on the first semiconductor substrate and a wiring layer formed on the second semiconductor substrate.

19. The semiconductor device according to claim 1, wherein the semiconductor package includes a plurality of the second semiconductor substrates.

20. The semiconductor device according to claim 19, wherein the plurality of second semiconductor substrates each drive a drive target circuit.

21. The semiconductor device according to claim 1, wherein the drive target circuit is one of an insulated gate bipolar transistor (IGBT) and a power transistor having a higher breakdown voltage than that of a circuit element constituting the drive circuit of the second semiconductor substrate.

22. The semiconductor device according to claim 21, wherein the drive target circuit includes at least one of an electric motor and a power supply circuit to be controlled by one of the IGBT and the power transistor.

23. The semiconductor device according to claim 1, wherein the control circuit includes at least one of an arithmetic circuit, an oscillation circuit, a PWM circuit, an analog-to-digital conversion circuit, and a digital-to-analog conversion circuit.

24. The semiconductor device according to claim 1, wherein the control circuit receives response data obtained from the control target circuit, without involving the second semiconductor substrate.

25. The semiconductor device according to claim 1, wherein the transmission circuit outputs, to the AC coupling element, a pulse signal corresponding to the transmission signal, the pulse signal having a higher frequency than the transmission signal.

26. The semiconductor device according to claim 1, wherein assuming that the transmission circuit is a first transmission circuit; the reception circuit is a first reception circuit; and the AC coupling element is a first AC coupling element, the second semiconductor substrate includes a second transmission circuit that transmits a signal obtained by modulating a transmission signal to the first semiconductor substrate, the first semiconductor substrate includes a second reception circuit that demodulates a signal received from the second semiconductor substrate and demodulates the transmission data; and the semiconductor device further comprises a second AC coupling element that transmits a signal, in an alternating manner, between the second transmission circuit and the second reception circuit.

* * * * *